United States Patent
Kim et al.

(10) Patent No.: US 7,112,831 B2
(45) Date of Patent: Sep. 26, 2006

(54) TERNARY CONTENT ADDRESSABLE MEMORY CELL

(75) Inventors: Jin-Ho Kim, Gyeonggi-do (KR); Jong-Mil Youn, Gyeonggi-do (KR); Bong-Hyun Choi, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 168 days.

(21) Appl. No.: 10/841,775

(22) Filed: May 6, 2004

(65) Prior Publication Data

US 2004/0223353 A1    Nov. 11, 2004

(30) Foreign Application Priority Data

May 6, 2003    (KR) .................... 10-2003-0028466
Dec. 11, 2003   (KR) .................... 10-2003-0090371

(51) Int. Cl.
H01L 27/10    (2006.01)
H01L 29/7694  (2006.01)
H01L 31/062   (2006.01)
H01L 31/113   (2006.01)
H01L 31/119   (2006.01)

(52) U.S. Cl. .................. 257/202; 257/393; 257/903
(58) Field of Classification Search ........ 257/202–204, 257/393, 903–904
See application file for complete search history.

(56) References Cited

U.S. PATENT DOCUMENTS

| 4,646,271 | A | 2/1987 | Uchiyama |
| 4,780,845 | A | 10/1988 | Threewitt |
| 5,319,590 | A | 6/1994 | Montoye |
| 5,490,102 | A | 2/1996 | Jubran |
| 5,495,382 | A | 2/1996 | Albon |
| 2004/0061143 | A1* | 4/2004 | Koolhaas et al. ........... 257/204 |

* cited by examiner

*Primary Examiner*—Cuong Nguyen
(74) *Attorney, Agent, or Firm*—Marger Johnson & McCollom, P.C.

(57) ABSTRACT

Ternary CAM cells are provided. The ternary CAM cell includes a pair of half cells. Each of the half cells includes an isolation layer formed at a predetermined region of a semiconductor substrate to define a match cell active region. A search gate electrode and a node gate electrode are placed to cross over the match cell active region. A match line is electrically connected to the match cell active region, which is adjacent to the node gate electrode and is located opposite the search gate electrode. An SRAM cell is provided at the semiconductor substrate adjacent to the match cell active region. The node gate electrode is electrically connected to one of a pair of storage nodes of the SRAM cell.

57 Claims, 27 Drawing Sheets

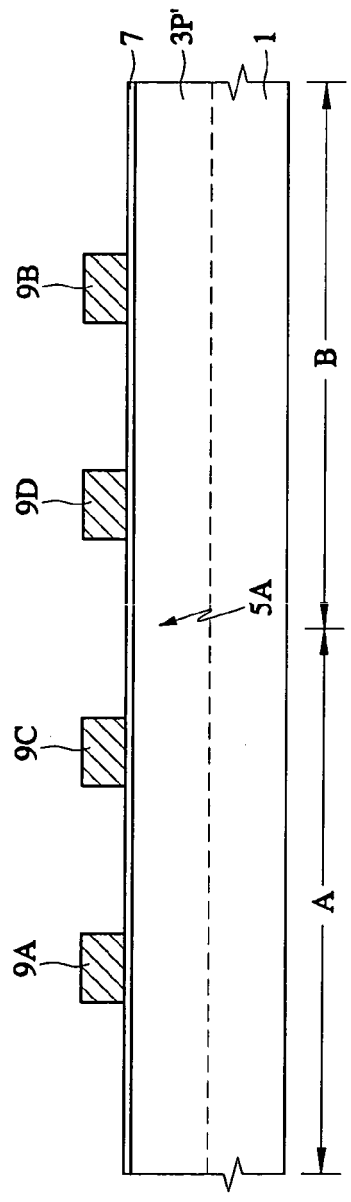
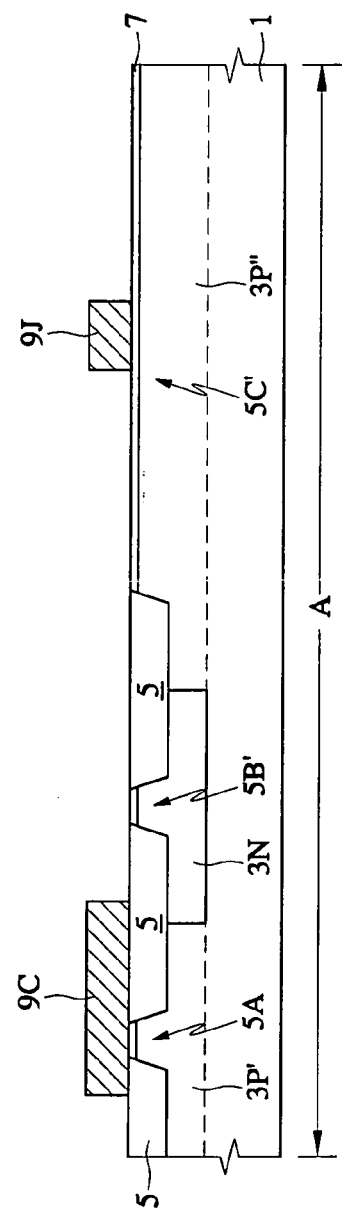

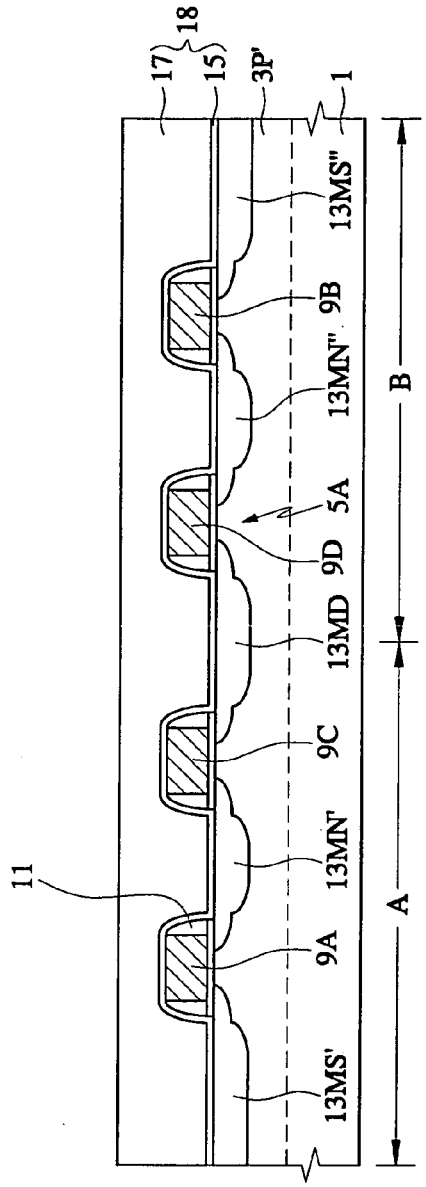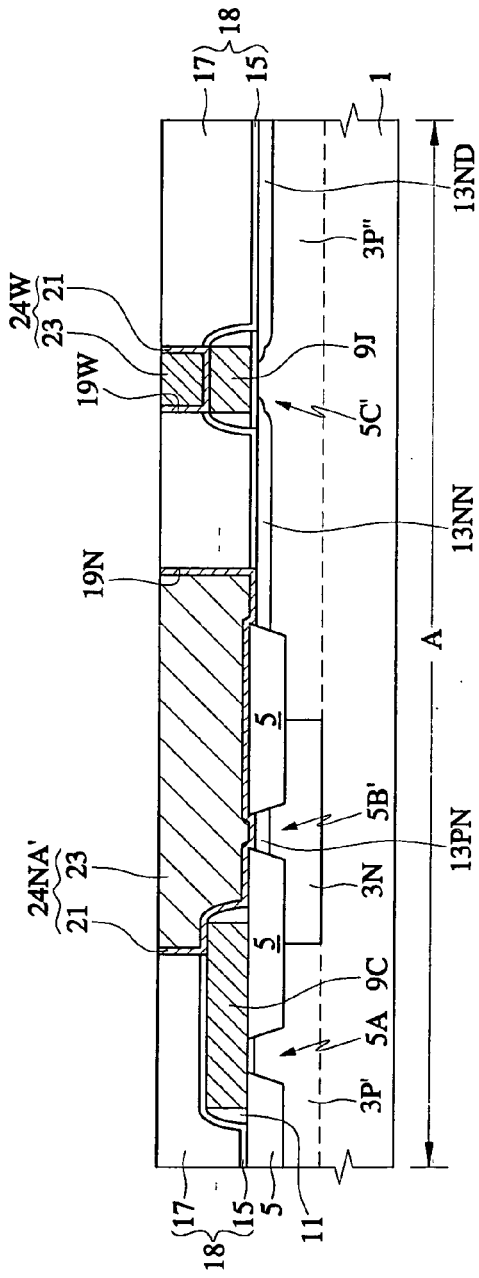

US 7,112,831 B2

TERNARY CONTENT ADDRESSABLE MEMORY CELL

CROSS-REFERENCE TO RELATED APPLICATION

This application claims priority from Korean Patent Application Nos. 2003-28466 and 2003-90371, filed on May 6, 2003 and on Dec. 11, 2003 respectively, the contents of which are hereby incorporated herein by reference in their entirety.

BACKGROUND OF THE INVENTION

1. Field of the Invention

The present invention relates to semiconductor devices and, more particularly, to ternary content addressable memory (CAM) cells.

2. Description of the Related Art

Random access memory (RAM) devices merely have functions to store and read out data. However, there have recently been many demands on semiconductor devices such as CAM devices having a function to compare the data stored in the RAM device with an external signal (search signal) as well as a function of the RAM device. A unit cell of the CAM includes at least one storage cell and a match cell. The storage cell corresponds to a typical memory cell such as an SRAM cell. Also, the match cell compares the data stored in the storage cell with the search signal and outputs an electrical signal that corresponds to the comparison result.

The CAM can be classified into a binary CAM and a ternary CAM. The binary CAM discriminates whether the data stored in the storage cell coincides with a search signal (hereinafter, referred to as "search data") or not. That is, the binary CAM has a function of which determines only two cases.

Examples of the binary CAM are taught in U.S. Pat. Nos. 4,646,271, 4,780,845, 5,490,102 and 5,495,382.

In the meantime, the ternary CAM typically includes two storage cells and a single match cell. The ternary CAM exhibits three kinds of output states according to the combination of the data stored in the pair of storage cells. That is, the ternary CAM may have a "don't care" state in addition to a match state and a non-match state. The ternary CAM is taught in U.S. Pat. No. 5,319,590, entitled "Apparatus for storing 'DON'T CARE' in a content addressable memory cell", the teachings of which are incorporated herein by reference.

FIG. 1 is an equivalent circuit diagram of the ternary CAM cell disclosed in the U.S. Pat. No. 5,319,590.

Referring to FIG. 1, the ternary CAM cell includes first and second storage cells 301 and 302, and a single match cell 102. Further, the ternary CAM cell includes two sets of bit lines /BL1, BL1, BL2, and /BL2. The first set of the bit lines /BL1 and BL1 are connected to the first storage cell 301 through access transistors 303 and 304 respectively, and the second set of the bit lines BL2, /BL2 are connected to the second storage cell 302 through access transistors 305 and 306 respectively. Gate electrodes of the access transistors 303, 304, 305 and 306 are connected to a word line.

The match cell 102 is composed of first to fourth transistors 102a, 102b, 102c and 102d. The first and second transistors 102a and 102b are serially connected, and the third and fourth transistors 102c and 102d are also serially connected. Drain regions of the first and third transistors 102a and 102c are connected to a match line MV, and source regions of the second and fourth transistors 102b and 102d are grounded. Further, gate electrodes of the first and third transistors 102a and 102c are connected to first and second search lines /ML, ML respectively, and gate electrodes of the second and fourth transistors 102b and 102d are connected to a data storage node a1 of the first storage cell 301 and a data storage node a2 of the second storage cell 302 respectively. The match line MV is generally pre-charged in a standby mode, thereby having a logic "1" state.

In this circuit, if data corresponding to a logic "0" is stored in the storage node a1 and a signal corresponding to a logic "1" is applied to the search line /ML, the voltage level of the match line MV may be unstable. This is because the drain region of the second transistor 102b (that is, the source region of the first transistor 102a) floats.

Embodiments of the invention address these and other limitations of the prior art.

SUMMARY OF THE INVENTION

Exemplary embodiments of the present invention provide ternary CAM cells.

In accordance with one aspect of the present invention, the ternary CAM cell includes a pair of half cells. Each of the half cells includes an isolation layer that is formed at a predetermined region of a semiconductor substrate to define a match cell active region. A search gate electrode and a node gate electrode are disposed to cross over the match cell active region. A match line is electrically connected to the match cell active region that is adjacent to the node gate electrode and is located opposite the search gate electrode. An SRAM cell is provided at the semiconductor substrate adjacent to the match cell active region. The node gate electrode is electrically connected to one of a pair of storage nodes of the SRAM cell. In some embodiments, the match cell active regions of the pair of half cells may be connected to each other. In other embodiments, the pair of half cells may be symmetric with each other with respect to a straight line crossing the match cell active region.

BRIEF DESCRIPTION OF THE DRAWINGS

The above and other features and advantages of the present invention will become more apparent to those of ordinary skill in the art by describing in detail preferred embodiments thereof with reference to the attached drawings in which:

FIGS. 10A and 10B are cross-sectional views, taken along the lines I—I and II—II of FIG. 3 respectively, to illustrate methods of fabricating a ternary CAM cell according to embodiments of the present invention.

FIGS. 11A and 11B are cross-sectional views, taken along the lines I—I and II—II of FIG. 4 respectively, to illustrate methods of fabricating a ternary CAM cell according to embodiments of the present invention.

DETAILED DESCRIPTION OF THE INVENTION

Figure 1:
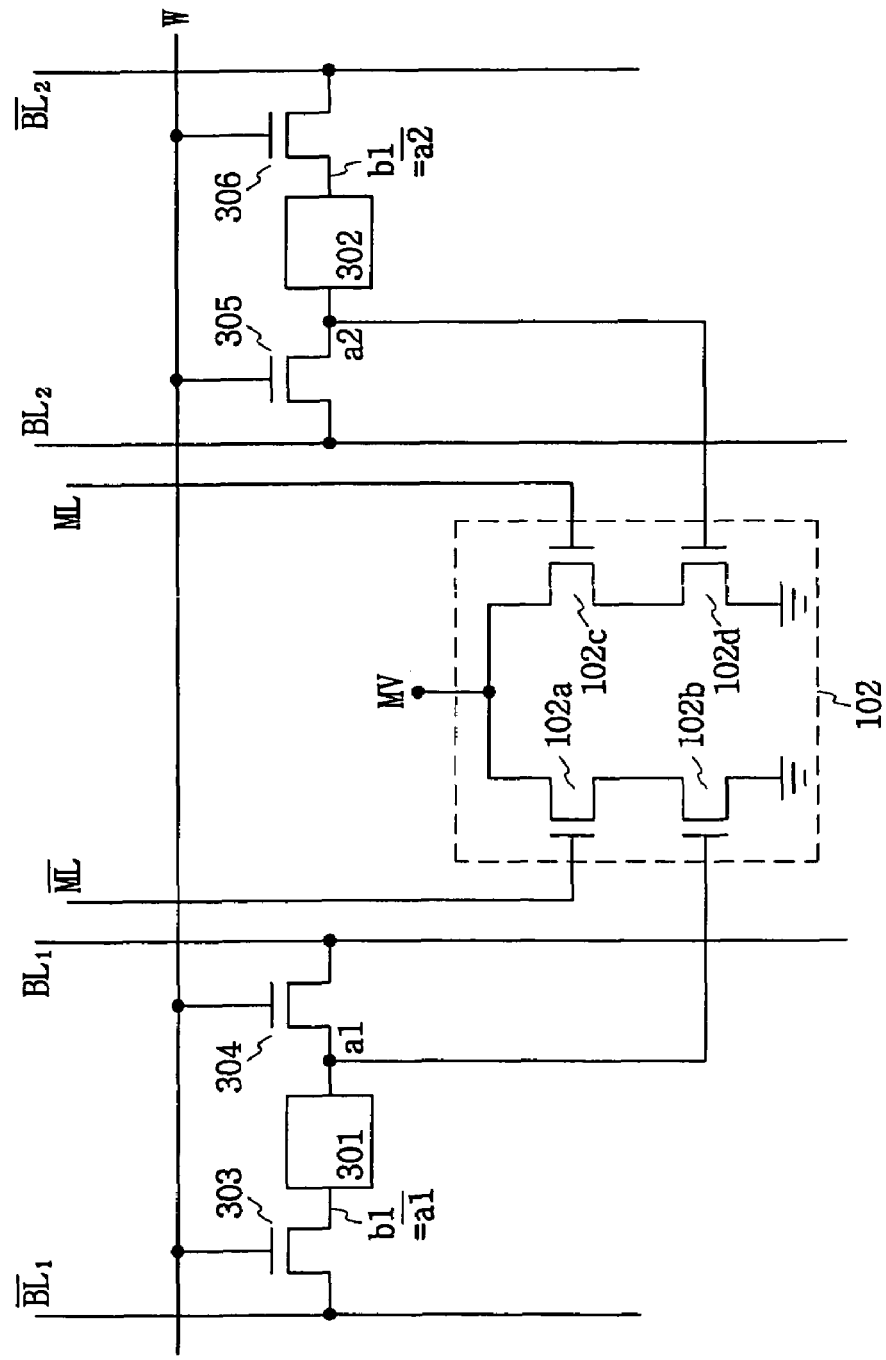
FIG. 1 is an equivalent circuit diagram illustrating a conventional ternary CAM cell.

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout the specification.

Figure 2:
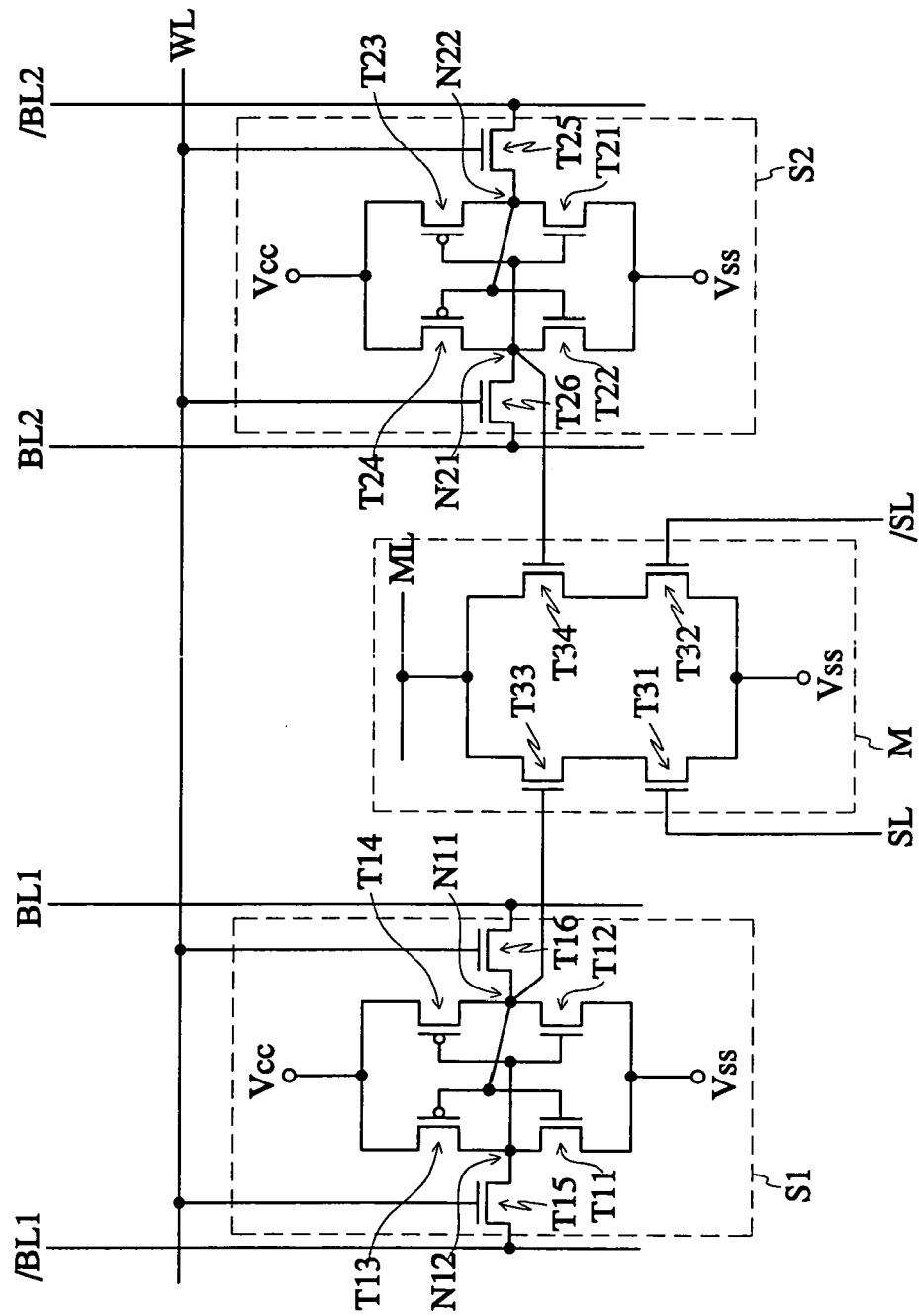
FIG. 2 is an equivalent circuit diagram illustrating a ternary CAM cell according to embodiments of the present invention.

FIG. 2 is an equivalent circuit diagram illustrating a ternary CAM cell according to embodiments of the present invention.

Referring to FIG. 2, the ternary CAM cell includes a pair of storage cells S1 and S2, and a match cell M. Each of the storage cells S1 and S2 may be a typical SRAM cell as shown in FIG. 2. That is, the first SRAM cell S1 includes a pair of driver transistors T11 and T12, a pair of load transistors T13 and T14, and a pair of access transistors T15 and T16. The first driver transistor T11 and the first load transistor T13 are serially connected to each other, thereby constituting a first inverter. The second driver transistor T12 and the second load transistor T14 are also serially connected to each other, thereby constituting a second inverter. Source regions of the first and second load transistors T13 and T14 are connected to a power line Vcc, and source regions of the first and second driver transistors T11 and T12 are connected to a ground line Vss. The first and second inverters are cross-coupled to each other, thereby constituting a latch circuit.

Drain regions of the second driver transistor T12 and the second load transistor T14 are electrically connected to a source region of the second access transistor T16, thereby constituting a first storage node N11. Similarly, drain regions of the first driver transistor T11 and the first load transistor T13 are electrically connected to a source region of the first access transistor T15, thereby constituting a second storage node N12. Thus, the first storage node N11 shows the logically opposite data to the second storage node N12. Drain regions of the first and second access transistors T15 and T16 are electrically connected to a pair of bit lines /BL1, BL1 respectively.

The second SRAM cell S2 is substantially identical to the first SRAM cell S1. That is, the second SRAM cell S2 includes first and second driver transistors T21 and T22, first and second load transistors T23 and T24, and first and second access transistors T25 and T26. Drain regions of the second driver transistor T22 and the second load transistor T24 are electrically connected to a source region of the second access transistor T26, thereby constituting a first storage node N21 of the second SRAM cell S2, and drain regions of the first driver transistor T21 and the first load transistor T23 are electrically connected to a source region of the first access transistor T25, thereby constituting a second storage node N22 of the second SRAM cell S2. Further, drain regions of the first and second access transistors T25 and T26 are electrically connected to a pair of bit lines /BL2, BL2 respectively.

Gate electrodes of the access transistors T15, T16, T25 and T26 are electrically connected to a word line WL.

The match cell M includes first to fourth transistors T31, T32, T33 and T34. The first to fourth transistors T31, T32, T33 and T34 may be NMOS transistors. The first and third transistors T31 and T33 are serially connected, and the second and fourth transistors T32, T34 are also serially connected. Source regions of the first and second transistors T31 and T32 are electrically connected to the ground line Vss, and drain regions of the third and fourth transistors T33 and T34 are electrically connected to a match line ML. The match line ML can be pre-charged in a standby mode. In this case, the match line ML has a logic high level in the standby mode. Gate electrodes of the third and fourth transistors T33 and T34 are connected to the first storage node N11 of the first SRAM cell S1 and the first storage node N21 of the second SRAM cell S2 respectively. That is, the gate electrode of the third transistor T33 corresponds to a first node gate electrode, and the gate electrode of the fourth transistor T34 corresponds to a second node gate electrode.

Gate electrodes of the first and second transistors T31 and T32 are electrically connected to first and second search lines SL and /SL respectively. As a result, the gate electrode of the first transistor T31 corresponds to a first search gate electrode, and the gate electrode of the second transistor T32 corresponds to a second search gate electrode. The first search line SL has the logically opposite data to the second search line /SL.

The operation of the ternary CAM cell shown in FIG. 2 is substantially identical to the explanation disclosed in U.S. Pat. No. 5,319,590. Thus, a description on the operation of the ternary CAM cell will be omitted.

Now, the structure of the ternary CAM cell shown in FIG. 2 will be described.

FIGS. 3 to 9 are top plan views illustrating the ternary CAM cell of FIG. 2, which is formed in a semiconductor substrate. In the drawings, the regions indicated by reference characters "A" and "B" represent a first half cell region and a second half cell region respectively.

Figure 3:
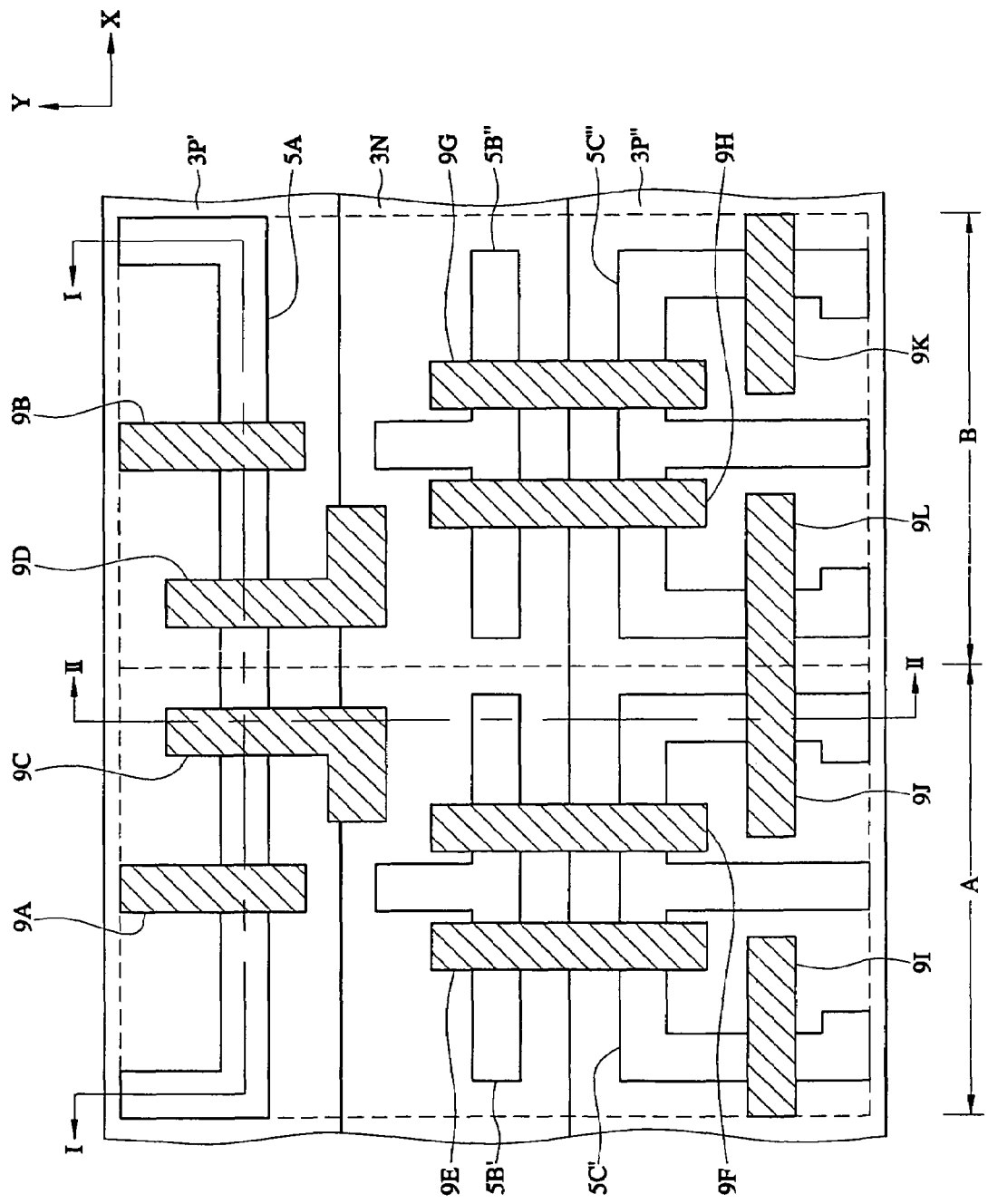
FIG. 3 is a top plan view illustrating active regions and gate electrodes of a ternary CAM cell according to embodiments of the present invention.

Referring to FIG. 3, a first active region 5A, i.e., a match cell active region is provided across the first and second half cell regions A and B. The match cell active region 5A is disposed to be parallel with an X-axis shown in FIG. 3. Also, first and second driver/access transistor active regions 5C' and 5C" are provided in the first and second half cell regions A and B respectively. In addition, a first load transistor active region 5B' is placed in the first half cell region A between the match cell active region 5A and the first driver/access transistor active region 5C', and a second load transistor active region 5B" is placed in the second half cell region B between the match cell active region 5A and the second driver/access transistor active region 5C'. Preferably, the match cell active region 5A is provided in a first P-well 3P', and the first and second driver/access transistor active regions 5C' and 5C" are provided in a second P-well 3P" that is spaced apart from the first P-well 3P'. In this case, the first and second load transistor active regions 5B' and 5B" are disposed in an N-well 3N between the first and second P-wells 3P' and 3P".

First and second search gate electrodes 9A and 9B are disposed to cross over the match cell active region 5A. The first and second search gate electrodes 9A and 9B are placed in the first and second half cell regions A and B respectively. As a result, the first and second search gate electrodes 9A and 9B are disposed to be parallel with a Y-axis shown in FIG. 3. The search gate electrodes 9A and 9B may be extended along the Y-axis to be in contact with another ternary CAM cell (not shown) located opposite the load transistor active regions 5B and 5B", as shown in FIG. 3. Both ends of the match cell active region 5A may also be extended along the Y-axis to be in contact with the other ternary CAM cell as shown in FIG. 3. First and second node gate electrodes 9C and 9D are disposed to cross over the match cell active region between the first and second search gate electrodes 9A and 9B. The first and second node gate electrodes 9C and 9D are placed in the first and second half cell regions A and B respectively.

The first search gate electrode 9A corresponds to a gate electrode of the first transistor T31 of the match cell M shown in FIG. 2, and the second search gate electrode 9B corresponds to a gate electrode of the second transistor T32 of the match cell M shown in FIG. 2. Further, the first node gate electrode 9C corresponds to a gate electrode of the third transistor T33 shown in FIG. 2, and the second node gate electrode 9D corresponds to a gate electrode of the fourth transistor T34 shown in FIG. 2.

The first and second load transistor active regions 5B' and 5B" may be disposed to be parallel with the X-axis. That is, the first and second load transistor active regions 5B' and 5B" may be placed in parallel with the match cell active region 5A. Each of the first and second driver/access transistor active regions 5C' and 5C" may include a driver transistor active region that is parallel with the match cell active region, a pair of access transistor active regions extended from the both ends of the driver transistor active region toward the opposite direction of the load transistor active region, and a ground active region extended from the central portion of the driver transistor active region toward the opposite direction of the load transistor active region. As a result, the ground active region is placed between the pair of access transistor active regions.

First and second common gate electrodes 9E and 9F are disposed to cross over the first load transistor active region 5B'. The first and second common gate electrodes 9E and 9F are extended to cross over the driver transistor active region of the first driver/access transistor active region 5C'. The ground active region of the first driver/access transistor active region 5C' is extended from the driver transistor active region between the first and second common gate electrodes 9E and 9F. In addition, first and second access gate electrodes 9I and 9J are provided to respectively cross over the pair of access active regions of the first driver/access transistor active region 5C'. The first and second access gate electrodes 9I and 9J are spaced apart from each other, and the ground active region passes through a region between the first and second access gate electrodes 9I and 9J. The first common gate electrode 9E acts as a common gate electrode of the first driver transistor T11 and the first load transistor T13 shown in FIG. 2, and the second common gate electrode 9F acts as a common gate electrode of the second driver transistor T12 and the second load transistor T14 shown in FIG. 2. Further, the first access gate electrode 9I corresponds to a gate electrode of the first access transistor T15 shown in FIG. 2, and the second access gate electrode 9J corresponds to a gate electrode of the second access transistor T16 shown in FIG. 2.

Similarly, first and second access gate electrodes 9K and 9L as well as first and second common gate electrodes 9G and 9H are provided in the second half cell region B.

Figure 4:
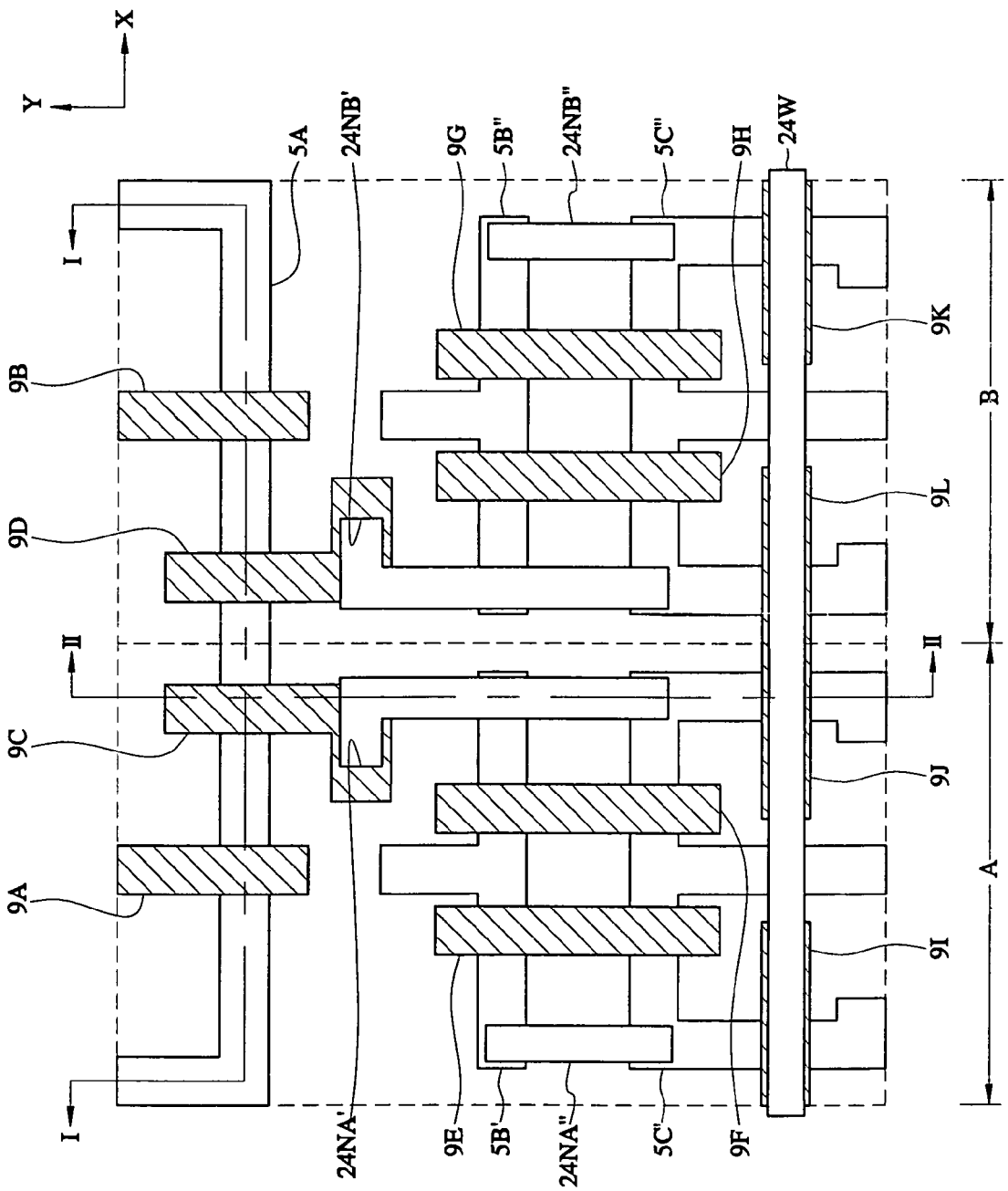
FIG. 4 is a top plan view illustrating node lines and word lines of a ternary CAM cell according to embodiments of the present invention.

Referring to FIG. 4, in the first half cell region A, one end of the first load transistor active region 5B' adjacent to the first common gate electrode 9E is electrically connected to the first driver/access transistor active region 5C' between the first common gate electrode 9E and the first access gate electrode 9I through an interconnection 24NA". Thus, the first load transistor (T13 of FIG. 2) and the first driver transistor (T11 of FIG. 2) are serially connected to constitute a first inverter. The interconnection 24NA" is placed to be parallel with the first common gate electrode 9E. Further, the other end of the first load transistor active region 5B' adjacent to the second common gate electrode 9F is electrically connected to the first driver/access transistor active region 5C' between the second common gate electrode 9F and the second access gate electrode 9J through a first node line 24NA'. Thus, the second load transistor (T14 of FIG. 2) and the second driver transistor (T12 of FIG. 2) are serially connected to constitute a second inverter. In addition, the first node line 24NA' is extended to be in contact with the first node gate electrode 9C. As a result, as shown in FIG. 2, the gate electrode of the third transistor T33 of the match cell M is electrically connected to the first storage node N11 of the first SRAM cell S1. The first node line 24NA' is also placed to be parallel with the second common gate electrode 9F.

Similarly, in the second half cell region B, one end of the second load transistor active region 5B" adjacent to the first common gate electrode 9G is electrically connected to the second driver/access transistor active region 5C" between the first common gate electrode 9G and the first access gate electrode 9K through an interconnection 24NB". Thus, the first load transistor (T23 of FIG. 2) and the first driver transistor (T21 of FIG. 2) are serially connected to constitute a first inverter. The interconnection 24NB" is placed to be parallel with the first common gate electrode 9G. Further, the other end of the second load transistor active region 5B" adjacent to the second common gate electrode 9H is electrically connected to the second driver/access transistor active region 5C" between the second common gate electrode 9H and the second access gate electrode 9L through a second node line 24NB'. Thus, the second load transistor (T24 of FIG. 2) and the second driver transistor (T22 of FIG. 2) are serially connected to constitute a second inverter. In addition, the second node line 24NB' is extended to contact the second node gate electrode 9D. As a result, as shown in FIG. 2, the gate electrode of the fourth transistor T34 of the match cell M is electrically connected to the first storage node N21 of the second SRAM cell S2. The second node line 24NB' is also placed to be parallel with the second common gate electrode 9H.

Further, a straight word line 24W is placed on the access gate electrodes 9I, 9J, 9K and 9L. The word line 24W is parallel with the X-axis and directly contacts the top surfaces of the access gate electrodes 9I, 9J, 9K and 9L. Thus, the access gate electrodes 9I, 9J, 9K and 9L are electrically connected to each other through the word line 24W. The word line 24W can be formed of the same conductive layer as the interconnections 24NA" and 24NB" as well as the node lines 24NA' and 24NB'.

Figure 5:
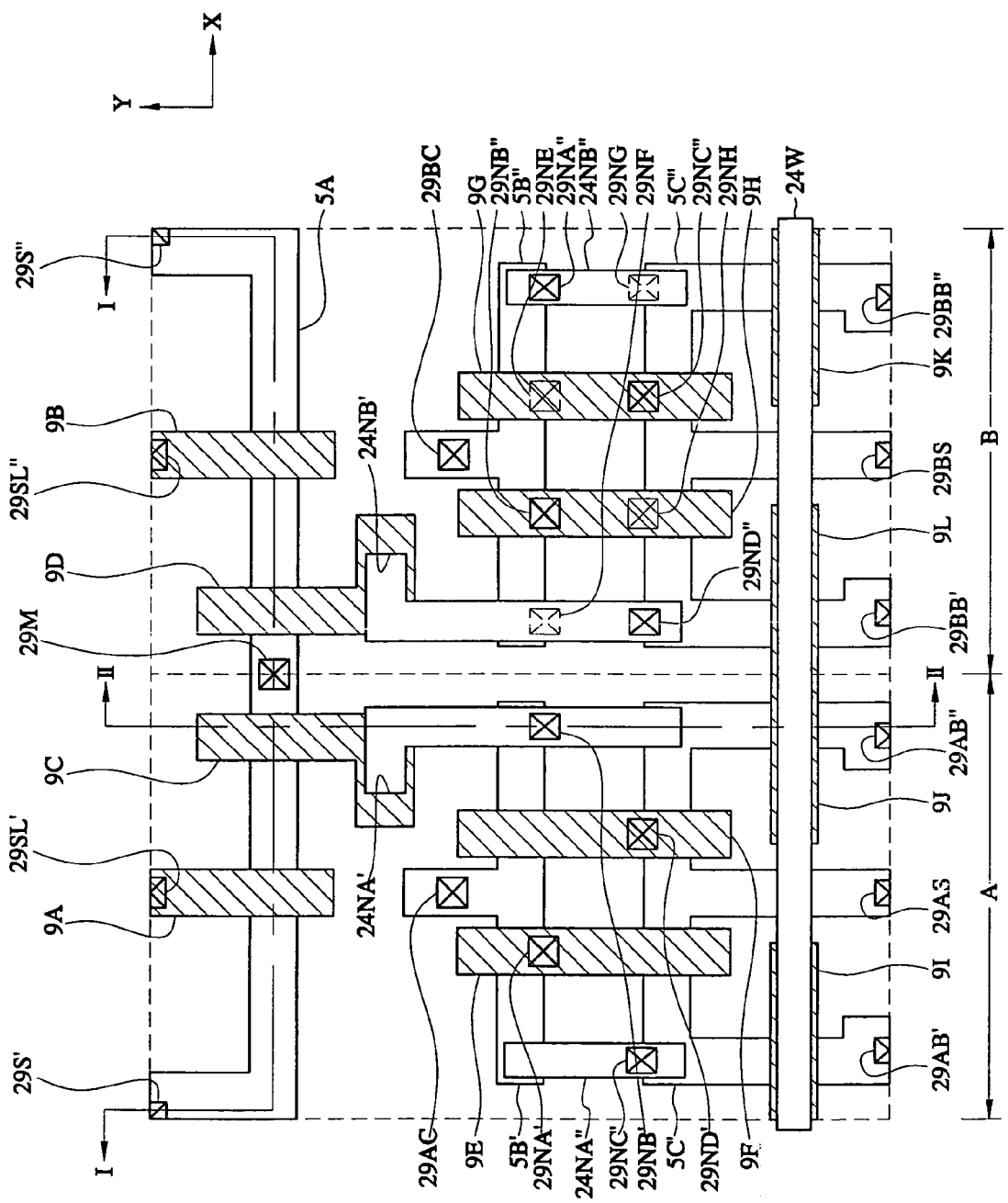
FIG. 5 is a top plan view illustrating lower bit line contact holes, memory cell ground line contact holes, node contact holes, power line contact holes, a match line pad contact hole, lower ground pad contact holes and lower search line pad contact holes of a ternary CAM cell according to embodiments of the present invention.

Referring to FIG. 5, both ends of the match cell active region 5A are exposed by first and second lower ground pad contact holes 29S' and 29S" respectively, and the match cell active region 5A between the first and second node gate electrodes 9C and 9D is exposed by a match line pad contact hole 29M. Also, the first and second search gate electrodes 9A and 9B are exposed by first and second lower search line pad contact holes 29SL' and 29SL" respectively.

Furthermore, the first common gate electrode 9E, the first node line 24NA', the interconnection 24NA" and the second common gate electrode 9F in the first half cell region A are exposed by first to fourth node contact holes 29NA', 29NB', 29NC' and 29ND' respectively, and the interconnection 24NB", the second common gate electrode 9H, the first common gate electrode 9G and the second node line 24NB' in the second half cell region B are exposed by fifth to eighth node contact holes 29NA", 29NB", 29NC" and 29ND" respectively. As shown in FIG. 5, the fifth to eighth node contact holes 29NA", 29NB", 29NC" and 29ND" are respectively asymmetrical with the first to fourth node contact holes 29NA', 29NB', 29NC' and 29ND' with respect to a straight line that crosses a central portion of the match cell active region 5A. Thus, ninth to twelfth node contact holes 29NE, 29NF, 29NG and 29NH may be arranged to be symmetrical with the first to fourth node contact holes 29NA', 29NB', 29NC' and 29ND' instead of the fifth to eighth node contact holes 29NA", 29NB", 29NC" and 29ND" (see contact holes indicated by a dotted line of FIG. 5). The ninth to twelfth node contact holes 29NE, 29NF, 29NG and 29NH expose the first common gate electrode 9G, the second node line 24NB', the interconnection 24NB" and the second common gate electrode 9H respectively.

Moreover, the first load transistor active region 5B' between the first and second common gate electrodes 9E and 9F is exposed by a first power line contact hole 29AC, and the second load transistor active region 5B" between the first and second common gate electrodes 9G and 9H is exposed by a second power line contact hole 29BC. Also, the ground active regions in the first and second half cell regions A and B are exposed by first and second ground line contact holes 29AS and 29BS respectively. In addition, the access transistor active regions, which are adjacent to the access gate electrodes 9I, 9J, 9K and 9L and are located opposite the interconnections 24NA" and 24NB", are exposed by lower bit line contact holes 29AB', 29AB", 29BB' and 29BB".

Figure 6:
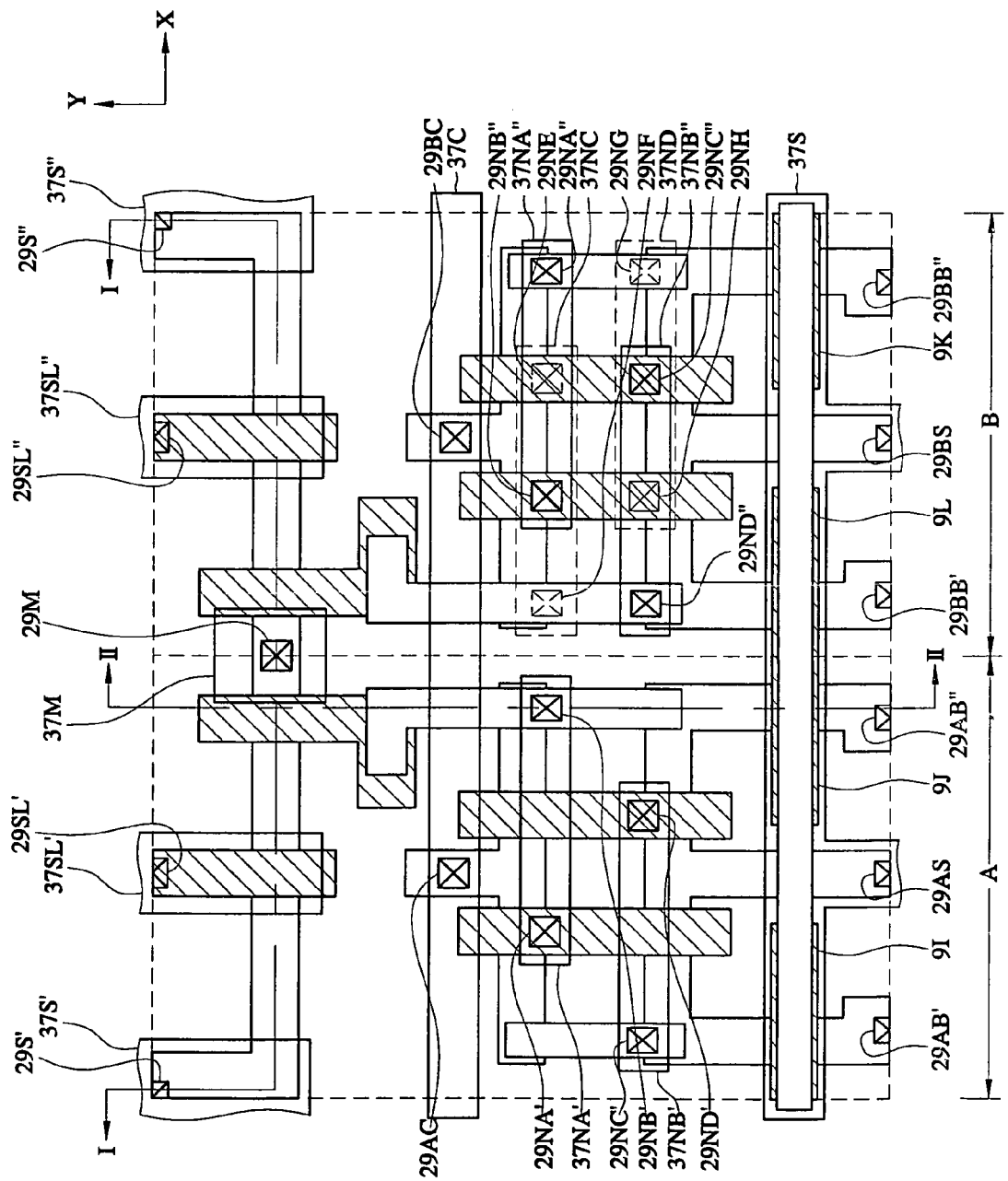
FIG. 6 is a top plan view illustrating a memory cell ground line, local interconnections, a power line, lower ground pads, lower search line pads and a match line pad of a ternary CAM cell according to embodiments of the present invention.

Referring to FIG. 6, the first and second lower ground pad contact holes 29S' and 29S" are covered with first and second lower ground pads 37S' and 37S" respectively. Thus, the first and second lower ground pads 37S' and 37S" are electrically connected to both ends of the match cell active region 5A respectively through the first and second lower ground pad contact holes 29S' and 29S". Also, the first and second lower search line pad contact holes 29SL' and 29SL" are covered with first and second lower search line pads 37SL' and 37SL" respectively, and the match line pad contact hole 29M is covered with a match line pad 37M. Thus, the first and second lower search line pads 37SL' and 37SL" are electrically connected to the first and second search gate electrodes 9A and 9B respectively through the first and second lower ground pad contact holes 29SL' and 29SL", and the match line pad 37M is electrically connected to the match cell active region 5A between the first and second node gate electrodes 9C and 9D through the match line pad contact hole 29M.

The power line contact holes 29AC and 29BC are covered with a power line 37C that is disposed to be parallel with the word line 24W. Thus, the power line 37C is electrically connected to the source regions of the load transistors of the first and second SRAM cells S1 and S2. Further, the first and second node contact holes 29NA' and 29NB' are covered with a first local interconnection 37NA', and the third and fourth node contact holes 29NC' and 29ND' are covered with a second local interconnection 37NB'. Thus, a latch circuit is provided in the first half cell region A. Similarly, the fifth and sixth node contact holes 29NA" and 29NB" are covered with a third local interconnection 37NA", and the seventh and eighth node contact holes 29NC" and 29ND" are covered with a fourth local interconnection 37NB". Thus, another latch circuit is provided in the second half cell region B. Alternatively, as mentioned in FIG. 5, if the ninth to twelfth node contact holes 29NE, 29NF, 29NG and 29NH are employed instead of the fifth to eighth node contact holes 29NA", 29NB", 29NC" and 29ND", the fifth and sixth local interconnections 37NC and 37ND are placed instead of the third and fourth local interconnections 37NA" and 37NB". The fifth and sixth local interconnections 37NC and 37ND are disposed to be symmetrical with the first and second local interconnections 37NA' and 37NB' respectively. The local interconnections are disposed to be parallel with the word line 24W.

Further, a ground line 37S is disposed over the word line 24W. A portion of the ground line 37S is extended to cover the ground line contact holes 29AS and 29BS. Thus, the ground line 37S is electrically connected to the source regions of the driver transistors of the first and second SRAM cells S1 and S2.

Figure 7:
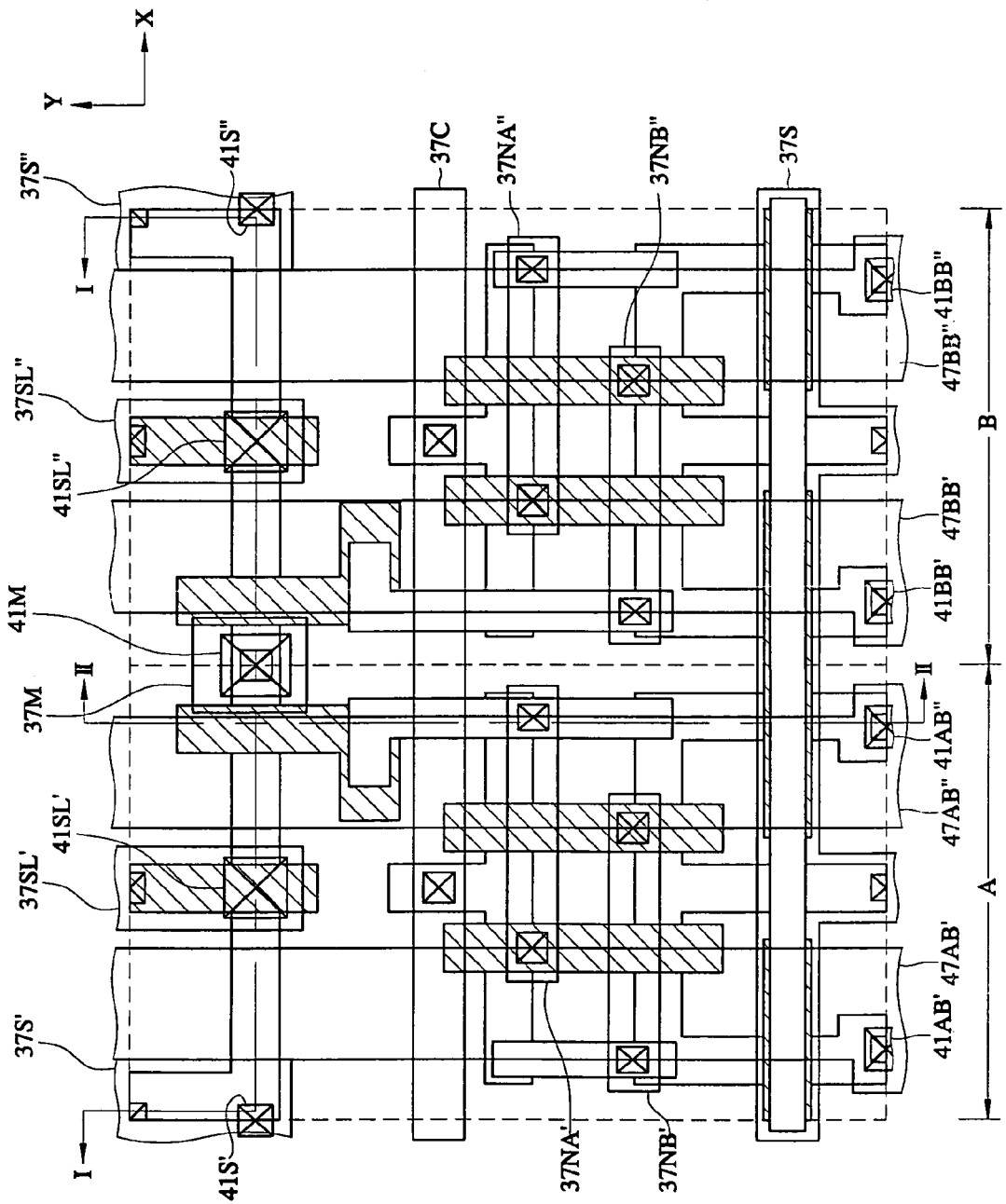
FIG. 7 is a top plan view illustrating upper bit line contact holes, upper ground pad contact holes, upper search line pad contact holes, a match line contact hole and bit lines of a ternary CAM cell according to embodiments of the present invention.

Referring to FIG. 7, the first and second lower ground pads 37S' and 37S" are exposed by first and second upper ground pad contact holes 41S' and 41S" respectively, and the first and second lower search line pads 37SL' and 37SL" are exposed by first and second upper search line pad contact holes 41SL' and 41SL" respectively. In addition, the match line pad 37M is exposed by a match line contact hole 41M.

Further, upper bit line contact holes 41AB', 41AB", 41BB' and 41BB" are placed over the lower bit line contact holes 29AB', 29AB", 29BB' and 29BB" respectively. The upper bit line contact holes 41AB', 41AB", 41BB' and 41BB" are covered with bit lines 47AB', 47AB", 47BB' and 47BB" respectively. The bit lines 47AB', 47AB", 47BB' and 47BB" are disposed to cross over the power line 37C and the ground line 37S.

Figure 8:
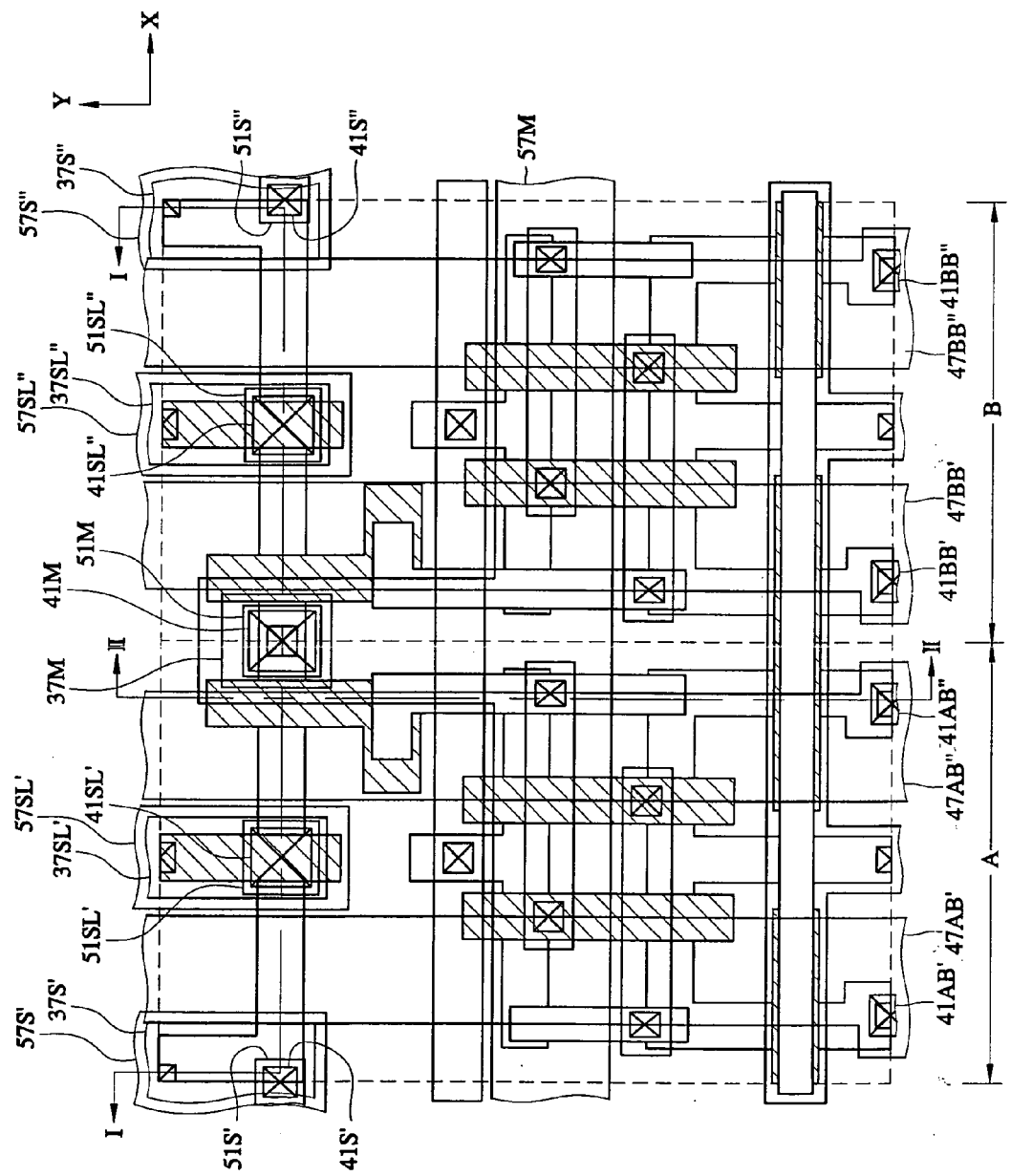
FIG. 8 is a top plan view illustrating other upper ground pad contact holes, other upper search line pad contact holes, another match line contact hole and a match line of a ternary CAM cell according to embodiments of the present invention.

Referring to FIG. 8, other first and second upper ground pad contact holes 51S' and 51S" may be additionally placed on the first and second upper ground pad contact holes 41S and 41S" respectively, and other first and second upper search line pad contact holes 51SL' and 51SL" may be additionally placed on the first and second upper search line pad contact holes 41SL' and 41SL" respectively. In addition, other match line contact hole 51M may be placed on the match line contact hole 41M.

The first and second upper ground pad contact holes 51S' and 51S" are covered with first and second upper ground pads 57S' and 57S" respectively, and the first and second upper search line pad contact holes 51 SL' and 51SL" are covered with first and second upper search line pads 57SL' and 57SL" respectively. In addition, the match line contact hole 51M is covered with a match line 57M that is disposed to be parallel with the power line 37C. The match line 57M corresponds to the match line ML shown in FIG. 2.

Figure 9:
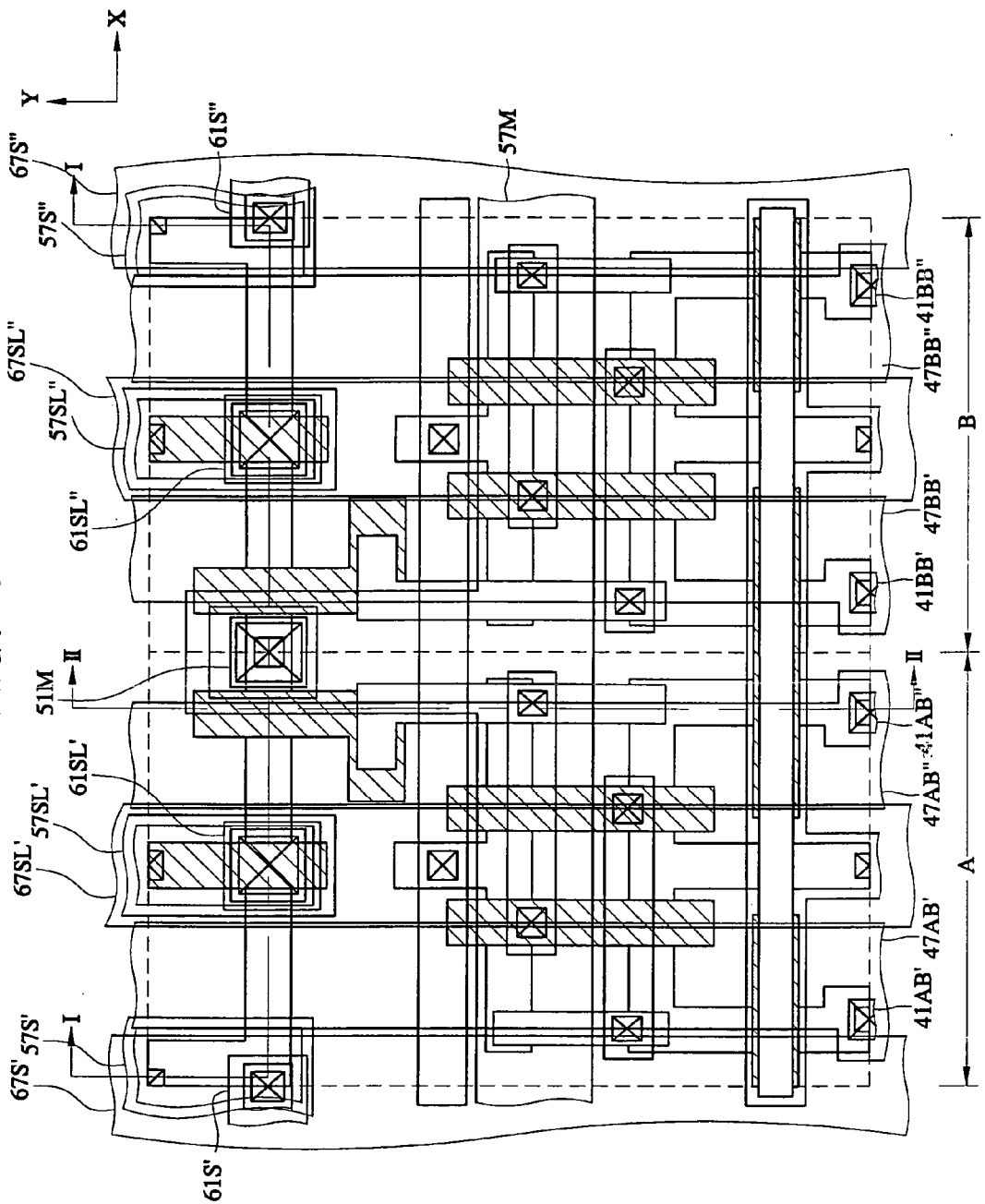
FIG. 9 is a top plan view illustrating ground line contact holes, search line contact holes, ground lines and search lines of a ternary CAM cell according to embodiments of the present invention.

Referring to FIG. 9, the first and second upper ground pads 57S' and 57S" are exposed by first and second match cell ground line contact holes 61S' and 61S" respectively, and the first and second upper search line pads 57SL' and 57SL" are exposed by first and second search line contact holes 61SL' and 61SL" respectively. The first and second match cell ground line contact holes 61S' and 61S" are covered with first and second match cell ground lines 67S' and 67S" respectively, and the first and second search line contact holes 61SL' and 61SL" are covered with first and second search lines 67SL' and 67SL" respectively. The first and second search lines 67SL' and 67SL" as well as the first and second match cell ground lines 67S' and 67S" are disposed to cross over the match line 57M.

As a result, a match cell (M of FIG. 2) is provided in the first P-well 3P', and a pair of storage cells (S1 and S2 of FIG. 2) are provided in the second P-well 3P" and the N-well 3N. The match cell ground lines 67S' and 67S" are formed of a different conductive layer from the ground line 37S of the storage cells S1 and S2 shown in FIG. 6. Thus, even though a noise signal is input to the match cell M through the match cell ground lines 67S' and 67S", it can prevent the storage cells S1 and S2 from being unstable due to the noise signal.

Hereinafter, methods of fabricating the ternary CAM cell shown in FIGS. 3 to 9 will be described. FIGS. 10A to 16A are sectional views taken along the lines I-I of FIGS. 3 to 9 respectively, and FIGS. 10B to 16B are sectional views taken along the lines II-II of FIGS. 3 to 9 respectively. In the drawings, the portions indicated by reference characters "A" and "B" represent first and second half cell regions respectively.

Referring to FIGS. 3, 10A and 10B, first and second P-wells 3P' and 3P", which are spaced apart from each other, are formed on a semiconductor substrate 1. An N-well 3N is formed between the first and second P-wells 3P' and 3P". The wells 3P', 3P" and 3N are formed across the first and second half cell regions A and B. An isolation layer 5 is then formed at a predetermined region of the semiconductor substrate having the wells 3P', 3P" and 3N. The isolation layer 5 defines first and second driver/access transistor active regions SC' and SC", a match cell active region 5A, and first and second load transistor active regions SB' and SB". The match cell active region 5A is defined to cross the first and second half cell regions A and B in the first P-well 3P', as shown in FIG. 3. Also, the first and second load transistor active regions SB' and SB" are defined in the N-well 3N inside the first half cell region A and in the N-well 3N inside the second half cell region B respectively. Further, the first and second driver/access transistor active regions SC' and SC" are defined in the second P-well 3P" inside the first half cell region A and in the second P-well 3P" inside the second half cell region B respectively.

A gate insulating layer 7 is formed on the active regions SA, SB', SB", SC' and SC". A first conductive layer is formed on the semiconductor substrate having the gate insulating layer 7. The first conductive layer is patterned to form match cell gate electrodes and storage cell gate electrodes. The match cell gate electrodes include first and second node gate electrodes 9C and 9D as well as first and second search gate electrodes 9A and 9B that cross over the match cell active region 5A. The first and second node gate electrodes 9C and 9D are formed between the first and second search gate electrodes 9A and 9B. The first search gate electrode 9A and the first node gate electrode 9C are formed in the first half cell region A, and the second search gate electrode 9B and the second node gate electrode 9D are formed in the second half cell region B. The first and second search gate electrodes 9A and 9B are preferably extended along a Y-axis direction, as shown in FIG. 3. In this case, a pair of the ternary CAM cells, which are adjacent to each other in the Y-axis, share the first and second search gate electrodes 9A and 9B.

The storage cell gate electrodes include first and second common gate electrodes 9E and 9F and first and second access gate electrodes 9I and 9J, which are formed in the first half cell region A, and first and second common gate electrodes 9G and 9H and first and second access gate electrodes 9K and 9L, which are formed in the second half cell region B. The first and second common gate electrodes 9E and 9F in the first half cell region A are formed to cross over the first load transistor active region 5B', and the first and second access gate electrodes 9I and 9J in the first half cell region A are formed to cross over the first driver/access transistor active region 5C'. The first and second common gate electrodes 9E and 9F are extended to cross over the first driver/access transistor active region 5C'. The first and second common gate electrodes 9G and 9H and the first and second access gate electrodes 9K and 9L in the second half cell region B are formed to be symmetric with the first and second common gate electrodes 9E and 9F and the first and second access gate electrodes 9I and 9J in the first half cell region A with respect to a straight line (a straight line in parallel with the Y-axis) that crosses the central portion of the match cell active region 5A.

Referring to FIGS. 4, 11A and 11B, gate spacers 11 are formed on the sidewalls of the gate electrodes, and impurity ions are implanted into the active regions between the gate electrodes to form LDD-type source/drain regions. The gate spacers 11 and the LDD-type source/drain regions can be formed using conventional manners. As a result, a first match cell source region 13MS' is formed at one end of the match cell active region 5A that is adjacent to the first search gate electrode 9A and is located opposite the first node gate electrode 9C, and a second match cell source region 13MS" is formed on the other end of the match cell active region 5A that is adjacent to the second search gate electrode 9B and is located opposite the second node gate electrode 9D. Further, a first common source/drain region 13MN' is formed at the match cell active region 5A between the first search gate electrode 9A and the first node gate electrode 9C, and a second common source/drain region 13MN" is formed at the match cell active region 5A between the second search gate electrode 9B and the second node gate electrode 9D. In addition, a match cell drain region 13MD is formed at the match cell active region 5A between the first and second node gate electrodes 9C and 9D.

Furthermore, source/drain regions are formed at the load transistor active regions 5B' and 5B" and the driver/access transistor active regions 5C' and 5C". For example, as shown in FIG. 11B, a first N-type node region 13NN is formed at the first driver/access transistor active region 5C' between the second common gate electrode 9F and the second access gate electrode 9J in the first half cell region A, and a bit drain region 13ND is formed at the first driver/access transistor active region 5C' that is adjacent to the second access gate electrode 9J and is located opposite the first N-type node region 13NN. Further, a first P-type node region 13PN is formed at one end of the load transistor active region 5B' that is adjacent to the second common gate electrode 9F.

A first interlayer insulating layer 18 is formed on the semiconductor substrate having the source/drain regions and the node regions. The first interlayer insulating layer 18 may be formed by sequentially stacking an etch stop layer 15 and a first insulating layer 17. The etch stop layer 15 is preferably formed of an insulating layer having an etch selectivity with respect to the first insulating layer 17. The first interlayer insulating layer 18 is patterned to form a first interconnection groove 19N and a second interconnection groove (not shown). The first interconnection groove 19N is formed to expose the first node gate electrode 9C, the first P-type node region 13PN and the first N-type node region 13NN, and the second interconnection groove is formed to expose the first load transistor active region 5B' and the first driver/access transistor active region 5C' that is adjacent to the first common gate electrode 9E and is located opposite the first interconnection groove 19N. While the first and second interconnection grooves are formed in the first half cell region A, first and second interconnection grooves (not shown) are also formed in the second half cell region B. In addition, a straight line shaped word line groove 19W, for exposing the access gate electrodes 91, 9J, 9K and 9L, may be formed during formation of the interconnection grooves.

A second conductive layer is formed on the semiconductor substrate having the grooves. The second conductive layer is planarized until the top surface of the first interlayer insulating layer 18 is exposed, thereby forming first and second interconnections 24NA' and 24NA" in the first half cell region A, first and second interconnections 24NB' and 24NB" in the second half cell region B, and a word line 24W crossing the first and second half cell regions A and B. The first interconnection 24NA' in the first half cell region A acts as a first node line that electrically connects the first node gate electrode 9C to the first node (N1 of FIG. 2) of the first storage cell, and the first interconnection 24NB' in the second half cell region B acts as a second node line that electrically connects the second node gate electrode 9D to the first node (N21 of FIG. 2) of the second storage cell. The second conductive layer can be formed by sequentially stacking a barrier metal layer 21 and an interconnection metal layer 23.

Figure 12A:
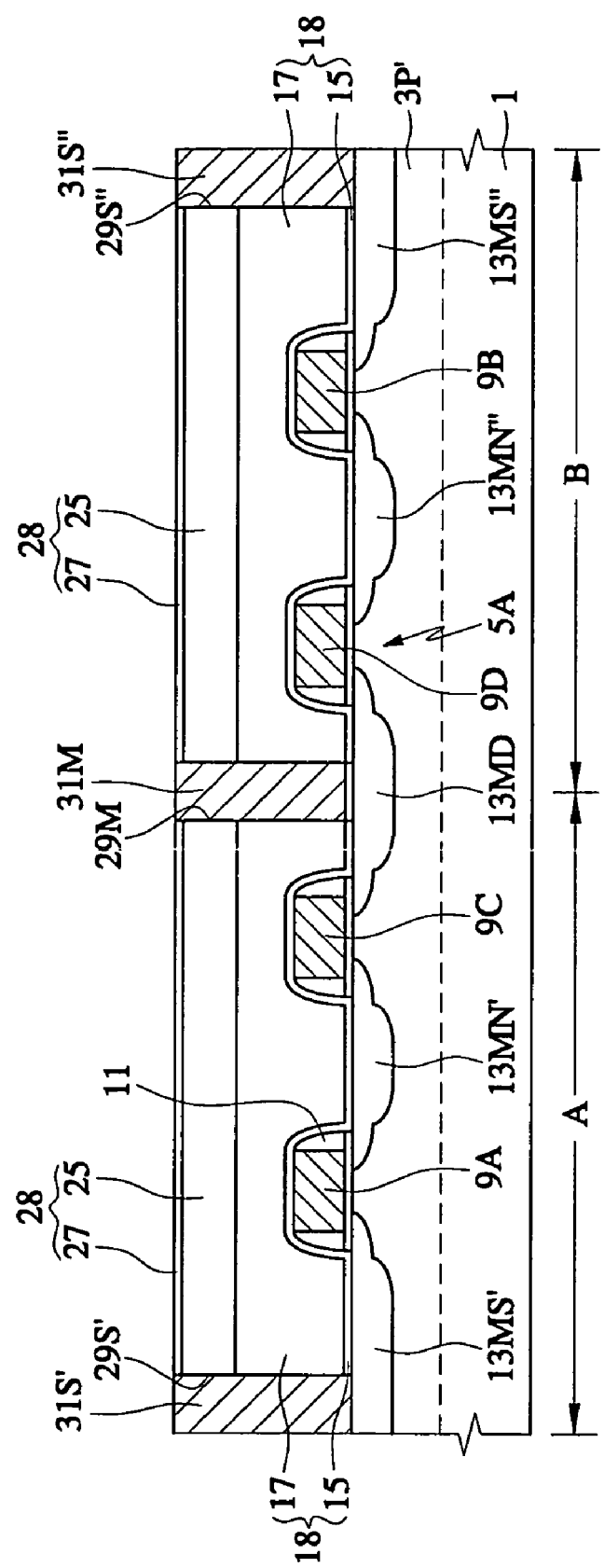
FIGS. 12A and 12B are cross-sectional views, taken along the lines I—I and II—II of FIG. 5 respectively, to illustrate methods of fabricating a ternary CAM cell according to embodiments of the present invention.
Figure 12B:
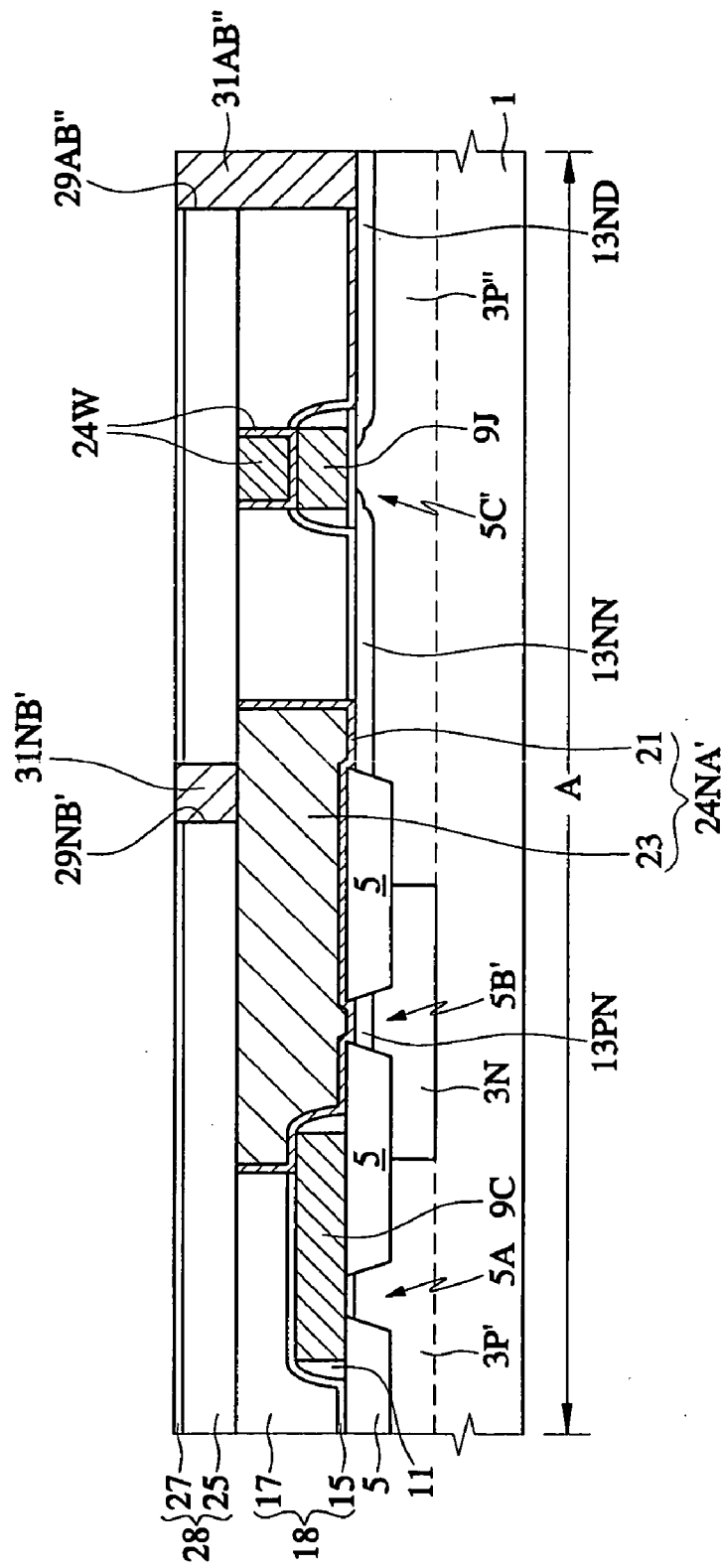

Referring to FIGS. 5, 12A and 12B, a second interlayer insulating layer 28 is formed on the semiconductor substrate having the interconnections 24NA', 24NA", 24NB' and 24NB" and the word line 24W. The second interlayer insulating layer 28 can be formed by sequentially stacking a second insulating layer 25 and a first polishing stop layer 27. The second interlayer insulating layer 28 and the first interlayer insulating layer 18 are patterned to form first contact holes. The first contact holes include first and second lower ground pad contact holes 29S' and 29S" that expose the first and second match cell source regions 13MS' and 13MS" respectively, first and second lower search line pad contact holes (29SL' and 29SL" of FIG. 5) that expose the first and second search gate electrodes 9A and 9B respectively, and a match line pad contact hole 29M that exposes the match cell drain region 13MD. In addition, the first contact holes include first to eighth node contact holes 29NA', 29NB', 29NC', 29ND', 29NA", 29NB", 29NC" and 29ND". The first to fourth node contact holes 29NA', 29NB', 29NC' and 29ND' are formed to expose the first common gate electrode 9E, the first node line 24NA', the interconnection 24NA" and the second common gate electrode 9F respectively, and the fifth to eighth node contact holes 29NA", 29NB", 29NC" and 29ND" are formed to expose the interconnection 24NB", the second common gate electrode 9H, the first common gate electrode 9G and the second node line 24NB' respectively.

In the meantime, as illustrated in FIG. 5, ninth to twelfth node contact holes 29NE, 29NF, 29NG and 29NH may be formed instead of the fifth to eighth node contact holes 29NA", 29NB", 29NC" and 29ND". The ninth to twelfth node contact holes 29NE, 29NF, 29NG and 29NH are formed to be symmetric with the first and fourth node contact holes 29NA', 29NB', 29NC' and 29ND' with respect to a straight line crossing the central portion of the match cell active region 5A.

Further, the first contact holes include first and second power line contact holes 29AC and 29BC, first and second ground line contact holes 29AS and 29BS, and lower bit line contact holes 29AB', 29AB", 29BB' and 29BB". In more detail, the first power line contact hole 29AC is formed to expose the first load transistor active region 5B' between the first and second common gate electrodes 9E and 9F, and the second power line contact hole 29BC is formed to expose the second load transistor active region 5B" between the first and second common gate electrodes 9G and 9H. The first ground line contact hole 29AS is formed to expose the first driver/access transistor active region 5C' between the first and second common gate electrodes 9E and 9F, and the second ground line contact hole 29BS is formed to expose the second driver/access transistor active region 5C" between the first and second common gate electrodes 9G and 9H. Further, the lower bit line contact holes 29AB', 29AB", 29BB' and 29BB" are formed to expose bit drain regions formed at both ends of the first and second driver/ access transistor active regions 5C' and 5C" respectively. For example, the lower bit line contact hole 29AB" exposes the bit drain region 13ND as shown in FIG. 12B.

Subsequently, first contact plugs may be formed in the first contact holes. The first contact plugs are formed of a third conductive layer. For example, first and second lower ground pad contact plugs 31 S' and 31 S" are formed in the first and second lower ground pad contact holes 29S' and 29S" respectively, as shown in FIGS. 12A and 12B, and a match line pad contact plug 31M is formed in the match line pad contact hole 29M. Also, a second node contact plug 31NB' is formed in the second node contact hole 29NB', and a lower bit line contact plug 31AB" is formed in the lower bit line contact hole 29AB".

Figure 13A:
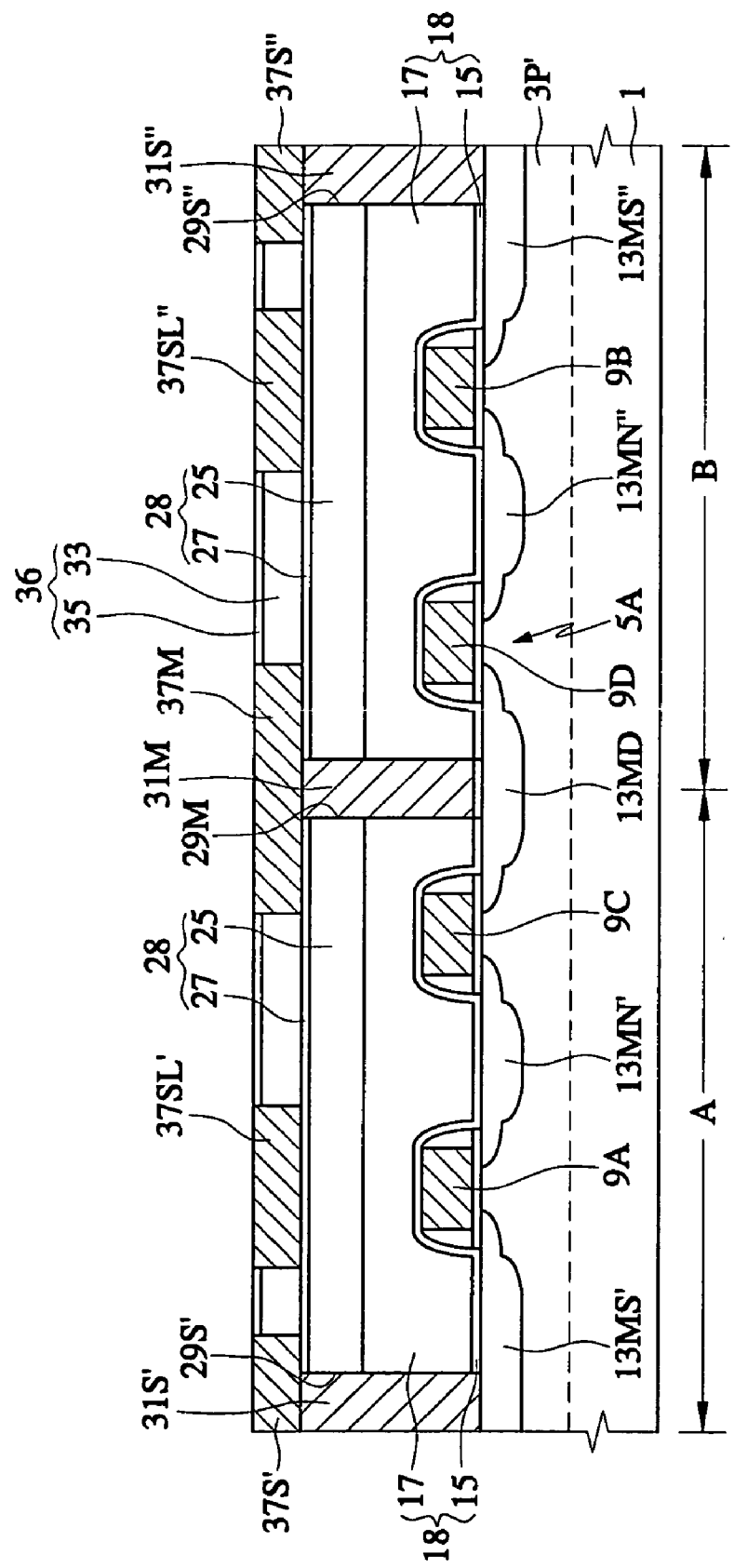
FIGS. 13A and 13B are cross-sectional views, taken along the lines I—I and II—II of FIG. 6 respectively, to illustrate methods of fabricating a ternary CAM cell according to embodiments of the present invention.
Figure 13B:
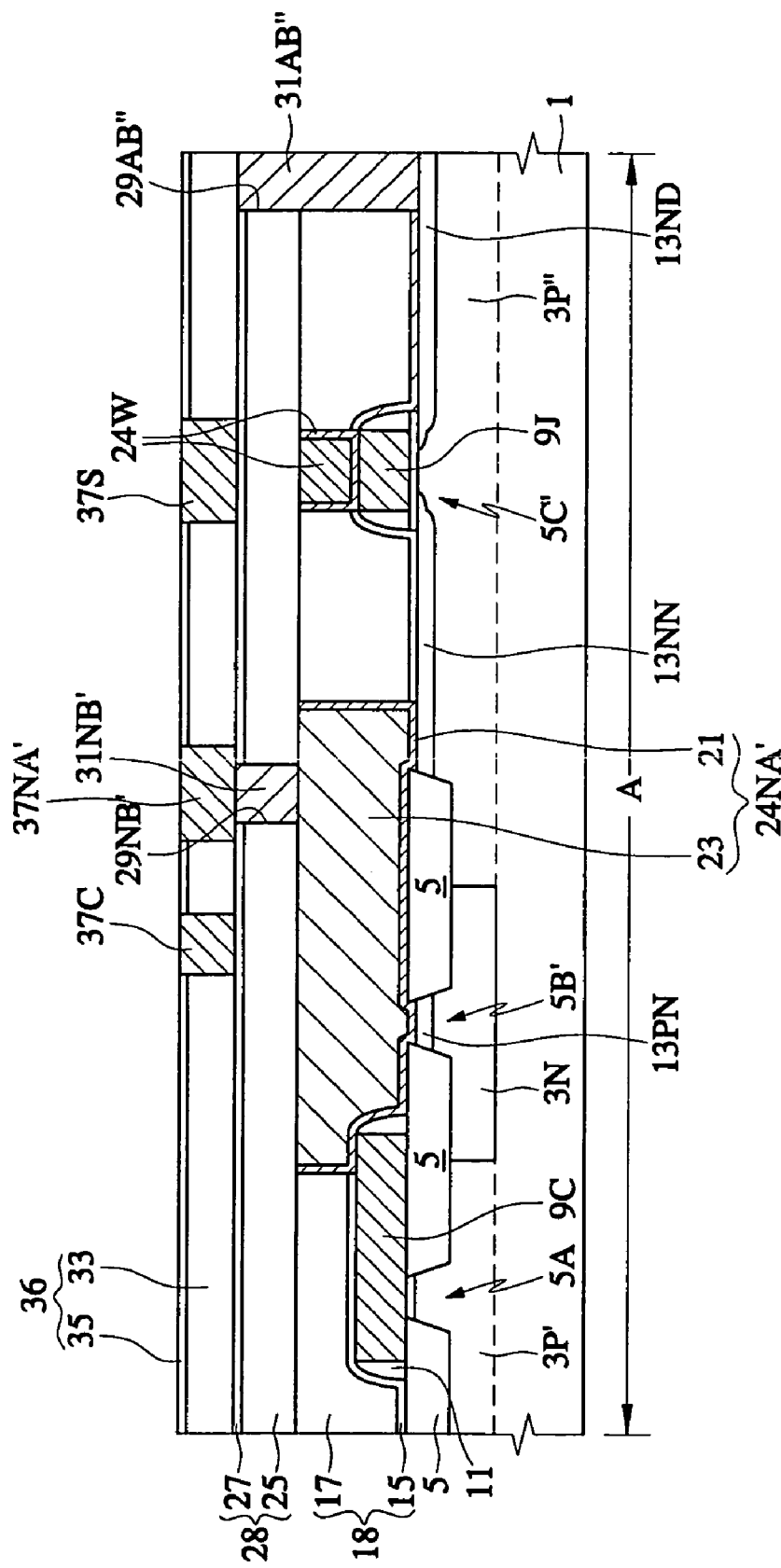

Referring to FIGS. 6, 13A and 13B, a third interlayer insulating layer 36 is formed on the semiconductor substrate having the first contact plugs. The third interlayer insulating layer 36 may be formed by sequentially stacking a third insulating layer 33 and a second polishing stop layer 35. Lower pads, a storage cell power line 37C, a storage cell ground line 37S and local interconnections are formed in the third interlayer insulating layer 36 using a conventional damascene process. The lower pads, the storage cell power line 37C, the storage cell ground line 37S and the local interconnections are formed of a fourth conductive layer.

The lower pads include first and second lower ground pads 37S and 37S" formed to contact the first and second lower ground pad contact plugs 31S' and 31S" respectively, first and second lower search line pads 37SL' and 37SL" formed to contact the first and second lower search line pad contact plugs (not shown) respectively, and a match line pad 37M formed to contact the match line pad contact plug 31M. The power line 37C is formed to contact the contact plugs (not shown) in the first and second power line contact holes 29AC and 29BC, and to cross the first and second half cell regions A and B. The ground line 37S is formed to contact the contact plugs (not shown) in the first and second ground contact holes 29AS and 29BS, and to be parallel with the power line 37C.

In addition, the local interconnections include first and second local interconnections 37NA' and 37NB' formed in the first half cell region A, and third and fourth local interconnections 37NA" and 37NB" formed in the second half cell region B. In detail, the first local interconnection 37NA' is formed to contact the contact plugs in the first and second node contact holes 29NA' and 29NB', and the second local interconnection 37NB' is formed to contact the contact plugs in the third and fourth node contact holes 29NC' and 29ND'. Further, the third local interconnection 37NA" is formed to contact the contact plugs in the fifth and sixth node contact holes 29NA" and 29NB", and the fourth local interconnection 37NB" is formed to contact the contact plugs in the seventh and the eighth node contact holes 29NC" and 29ND".

Alternatively, as described with reference to FIGS. 5, 12A and 12B, if the ninth to twelfth node contact holes 29NE, 29NF, 29NG and 29NH are formed instead of the fifth to eighth node contact holes 29NA", 29NB", 29NC" and 29ND", fifth and sixth local interconnections 37NC and 37ND are formed instead of the third and fourth local interconnections 37NA" and 37NB". The fifth and sixth local interconnections 37NC and 37ND are formed to be symmetric with the first and second local interconnections 37NA' and 37NB' respectively.

Figure 14A:
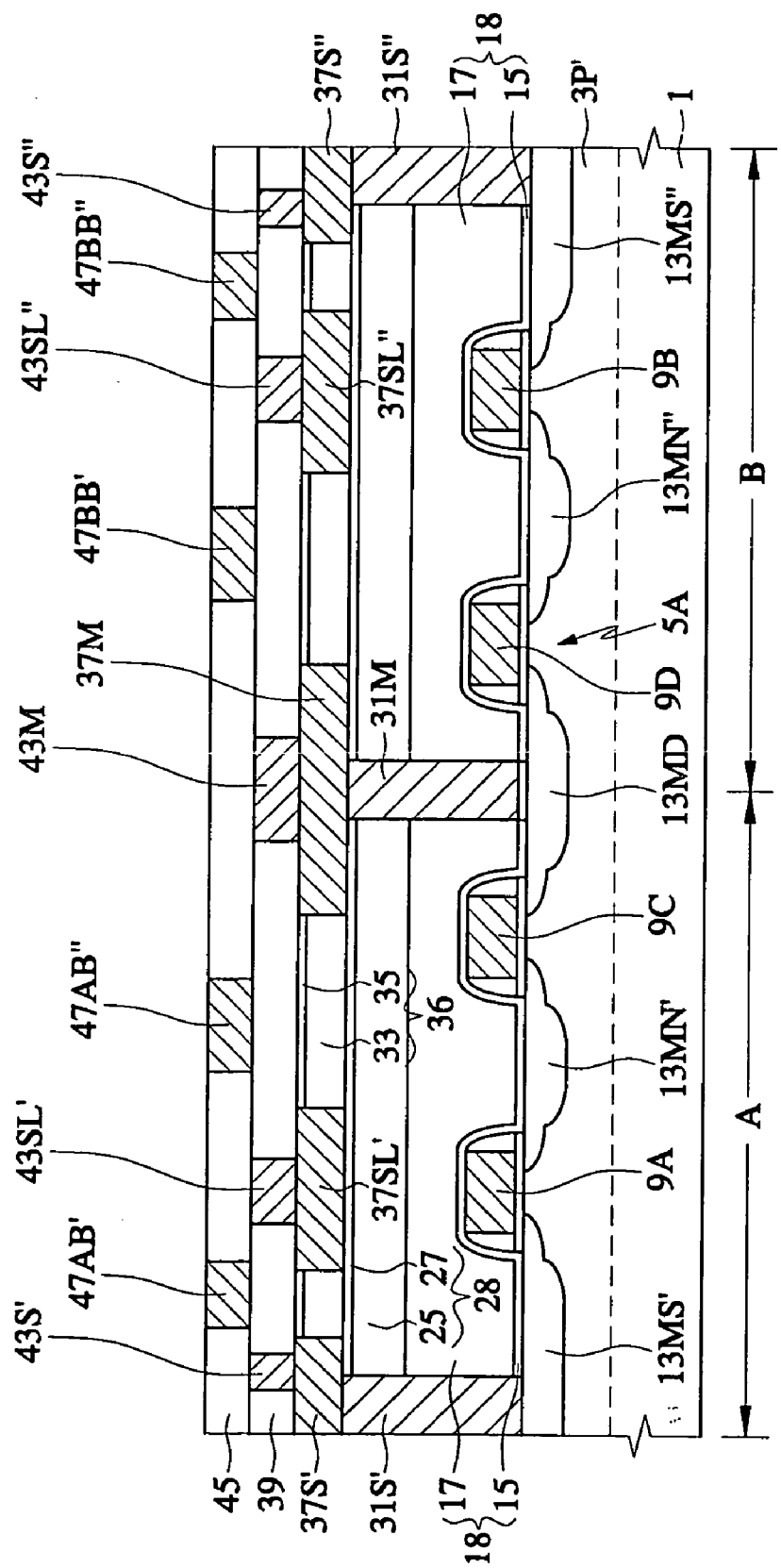
FIGS. 14A and 14B are cross-sectional views, taken along the lines I—I and II—II of FIG. 7 respectively, to illustrate methods of fabricating a ternary CAM cell according to embodiments of the present invention.
Figure 14B:
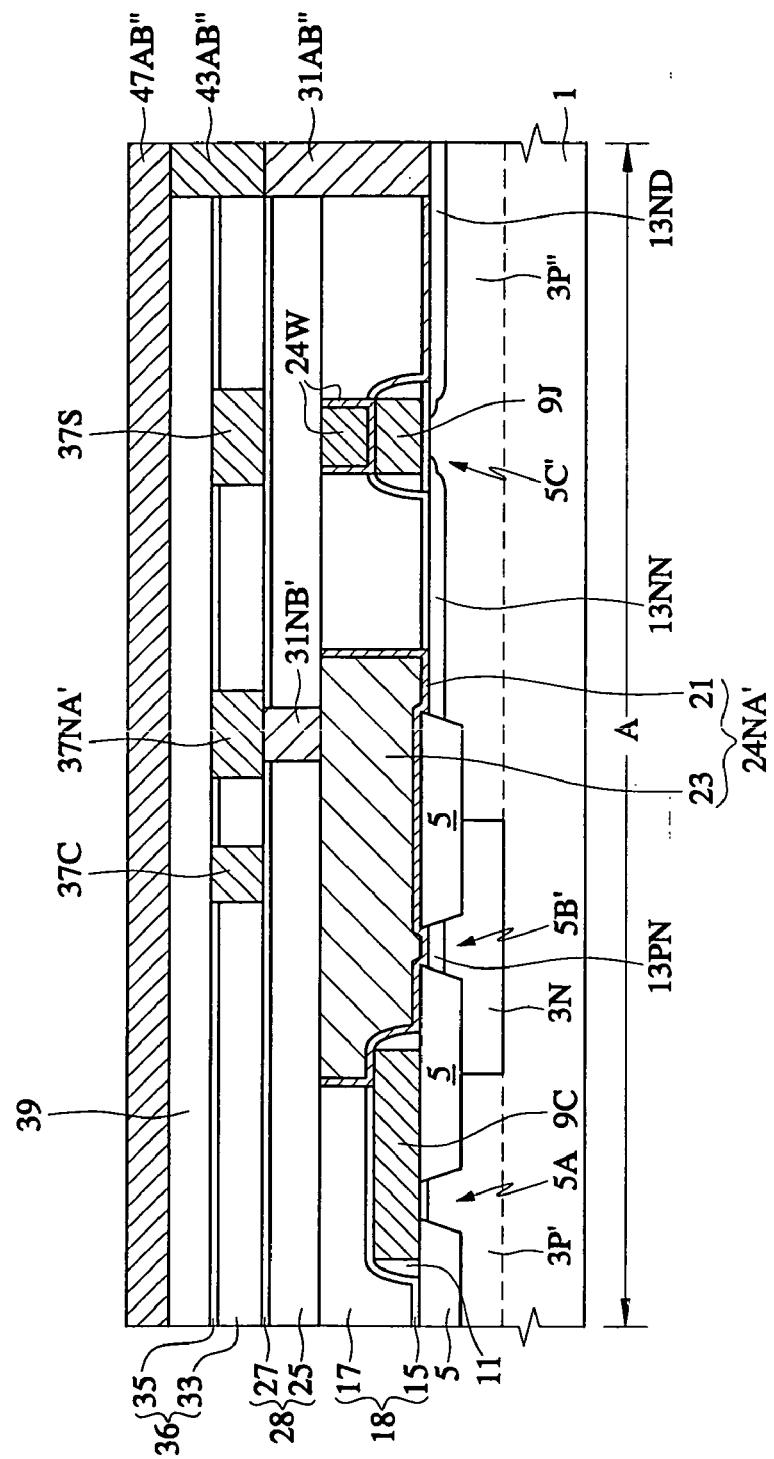

Referring to FIGS. 7, 14A and 14B, a fourth interlayer insulating layer 39 is formed on the semiconductor substrate having the lower pads 37S', 37S", 37SL', 37SL" and 37M, the storage cell power line 37C, the storage cell ground line 37S, and the local interconnections. The fourth interlayer insulating layer 39 may be formed using the same method as the second or third interlayer insulating layer 28 or 36. The fourth interlayer insulating layer 39 and the third interlayer insulating layer 36 are patterned to form second contact holes. The second contact holes include upper bit line contact holes 41AB', 41AB", 41BB' and 41BB" that expose the lower bit line contact plugs (for example, 31AB" of FIG. 14B). In addition, the second contact holes include first and second upper search line pad contact holes 41SL' and 41SL" exposing the first and second lower search line pads 37SL' and 37SL" respectively as well as first and second upper ground pad contact holes 41S' and 41S" exposing the first and second lower ground pads 37S' and 37S" respectively. Further, the second contact holes include a match line contact hole 41M exposing the match line pad 37M.

Second contact plugs are formed in the second contact holes. The second contact plugs are formed of a fifth conductive layer. For example, as shown in FIG. 14A, the second contact plugs include first and second upper ground pad contact plugs 43S' and 43S" that fill the first and second upper ground pad contact holes 41S' and 41S" respectively, first and second upper search line pad contact plugs 43SL' and 43SL" that fill the first and second upper search line pad contact holes 41SL' and 41SL" respectively, and a match line contact plug 43M that fill the match line contact hole 41M. Further, the second contact plugs include upper bit line contact plugs (for example, 43AB" of FIG. 14B) that fill the upper bit line contact holes 41AB', 41AB", 41BB' and 41BB".

A fifth interlayer insulating layer 45 is formed on the semiconductor substrate having the second contact plugs. Two pairs of parallel bit lines 47AB', 47AB", 47BB' and 47BB" are formed in the fifth interlayer insulating layer 45 using a conventional damascene process. The bit lines are formed of a sixth conductive layer. The bit lines are formed to contact the upper bit line contact plugs respectively. For example, the bit line 47AB" is formed to contact the upper bit line contact plug 43AB" as shown in FIG. 14B.

Figure 15A:
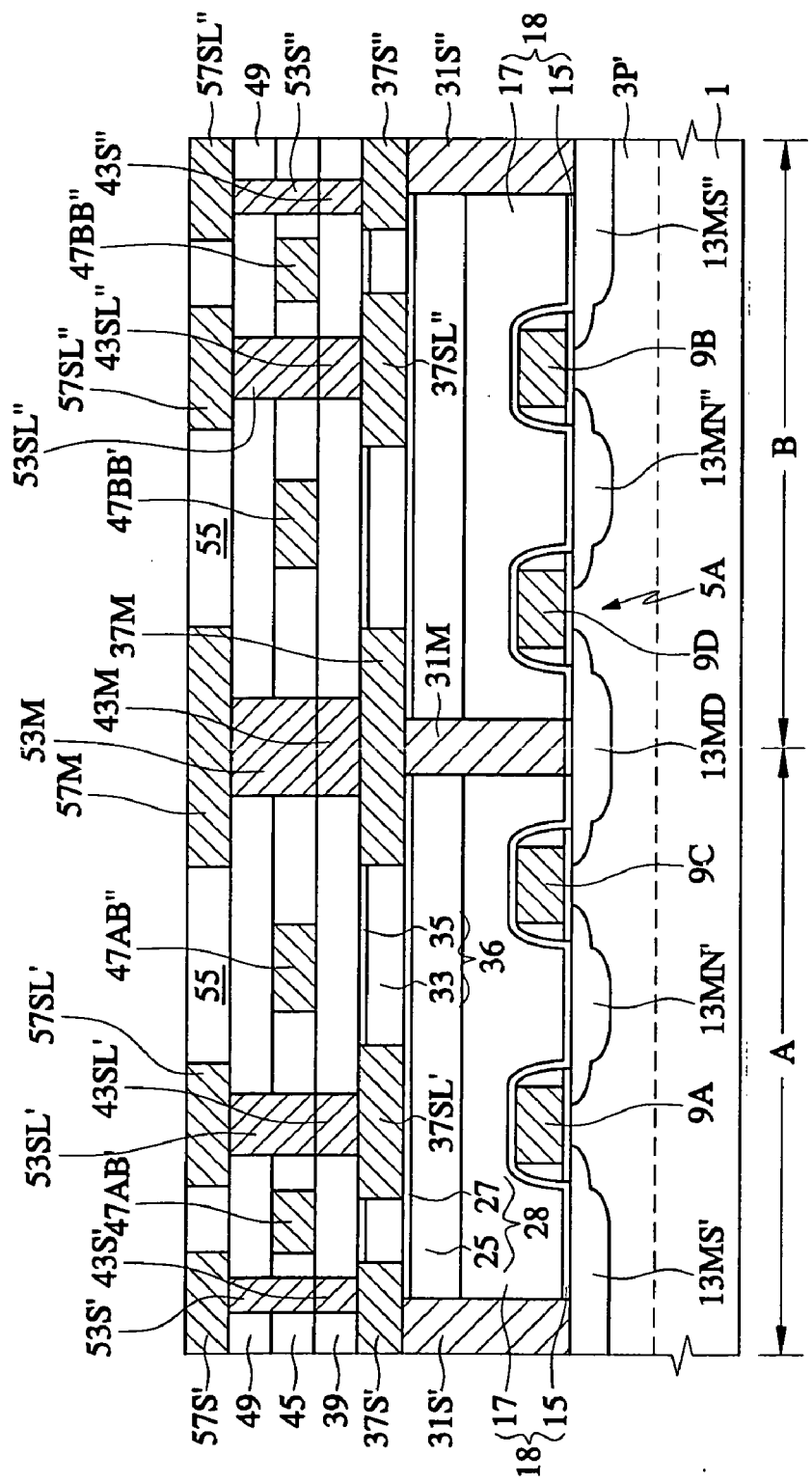
FIGS. 15A and 15B are cross-sectional views, taken along the lines I—I and II—II of FIG. 8 respectively, to illustrate methods of fabricating a ternary CAM cell according to embodiments of the present invention.
Figure 15B:
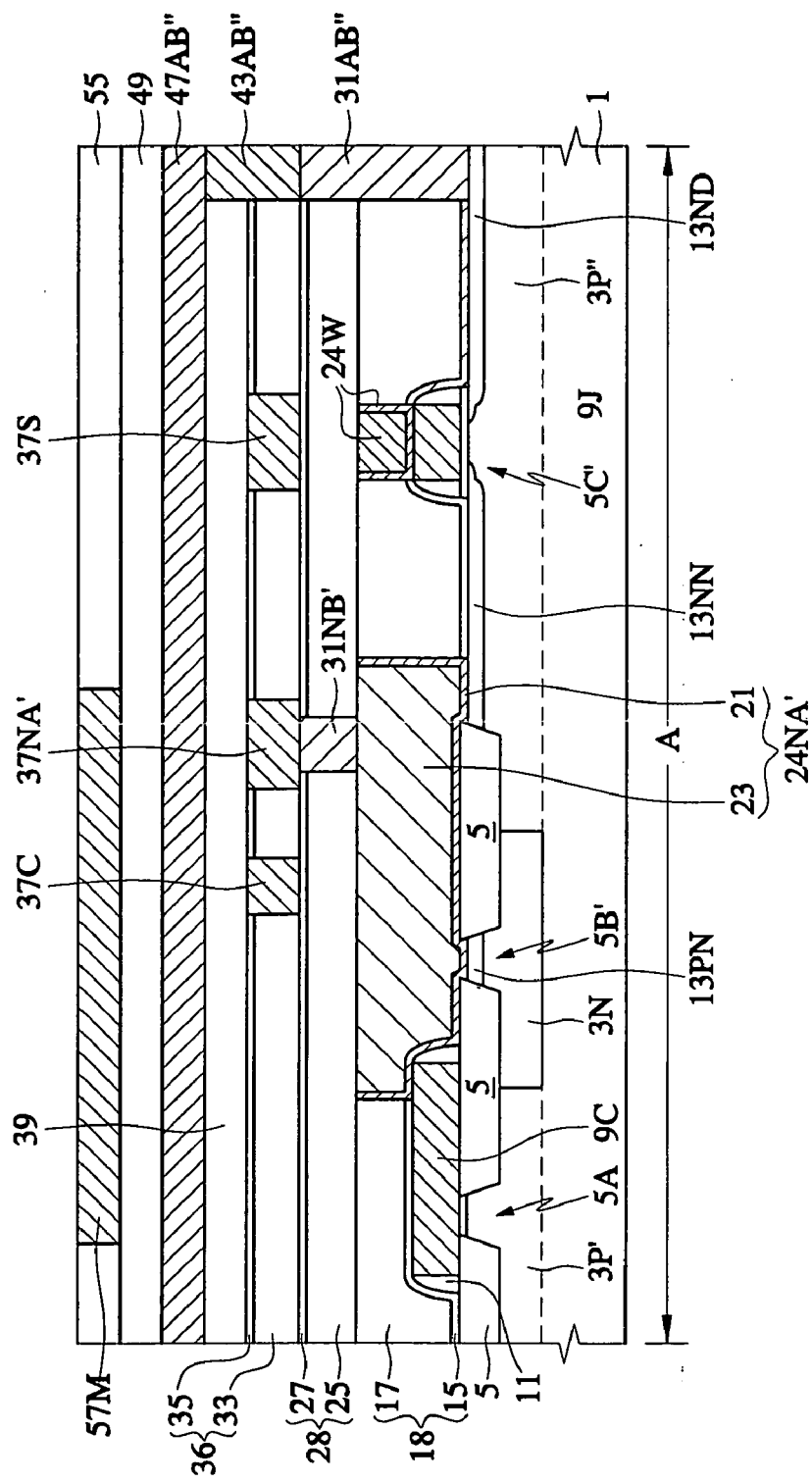

Referring to FIGS. 8, 15A and 15B, a sixth interlayer insulating layer 49 is formed on the semiconductor substrate including the bit lines 47AB', 47AB", 47BB' and 47BB". The sixth interlayer insulating layer 49 and the fifth interlayer insulating layer 45 are patterned to form third contact holes. The third contact holes include first and second upper search line pad contact holes 51SL' and 51SL" formed to expose the first and second upper search line pad contact plugs 43SL' and 43SL" respectively, and first and second upper ground pad contact holes 51S' and 51S" formed to expose the first and second upper ground pad contact plugs 43S' and 43S" respectively. Further, the third contact holes include a match line contact hole 51M formed to expose the match line contact plug 43M.

Then, third contact plugs are formed in the third contact holes. The third contact plugs are formed of a seventh conductive layer. As a result, the third contact plugs include first and second upper search line pad contact plugs 53L' and 53L" formed in the first and second upper search line pad contact holes 51SL' and 51SL" respectively, and first and second upper ground pad contact plugs 53S' and 53S" formed in the first and second upper ground pad contact holes 51S' and 51S" respectively. Further, the third contact plugs include a match line contact plug 53M formed in the match line contact hole 51M.

Subsequently, a seventh interlayer insulating layer 55 is formed on the semiconductor substrate having the third contact plugs. First and second upper ground pads 57S' and 57S", first and second upper search line pads 57SL' and 57SL", and a match line 57M are formed in the seventh interlayer insulating layer 55 using a damascene process. The upper ground pads 57S' and 57S", the upper search line pads 57SL' and 57SL", and the match line 57M are formed of an eighth conductive layer. The match line 57M is formed to cross the first and second half cell regions A and B.

Figure 16A:
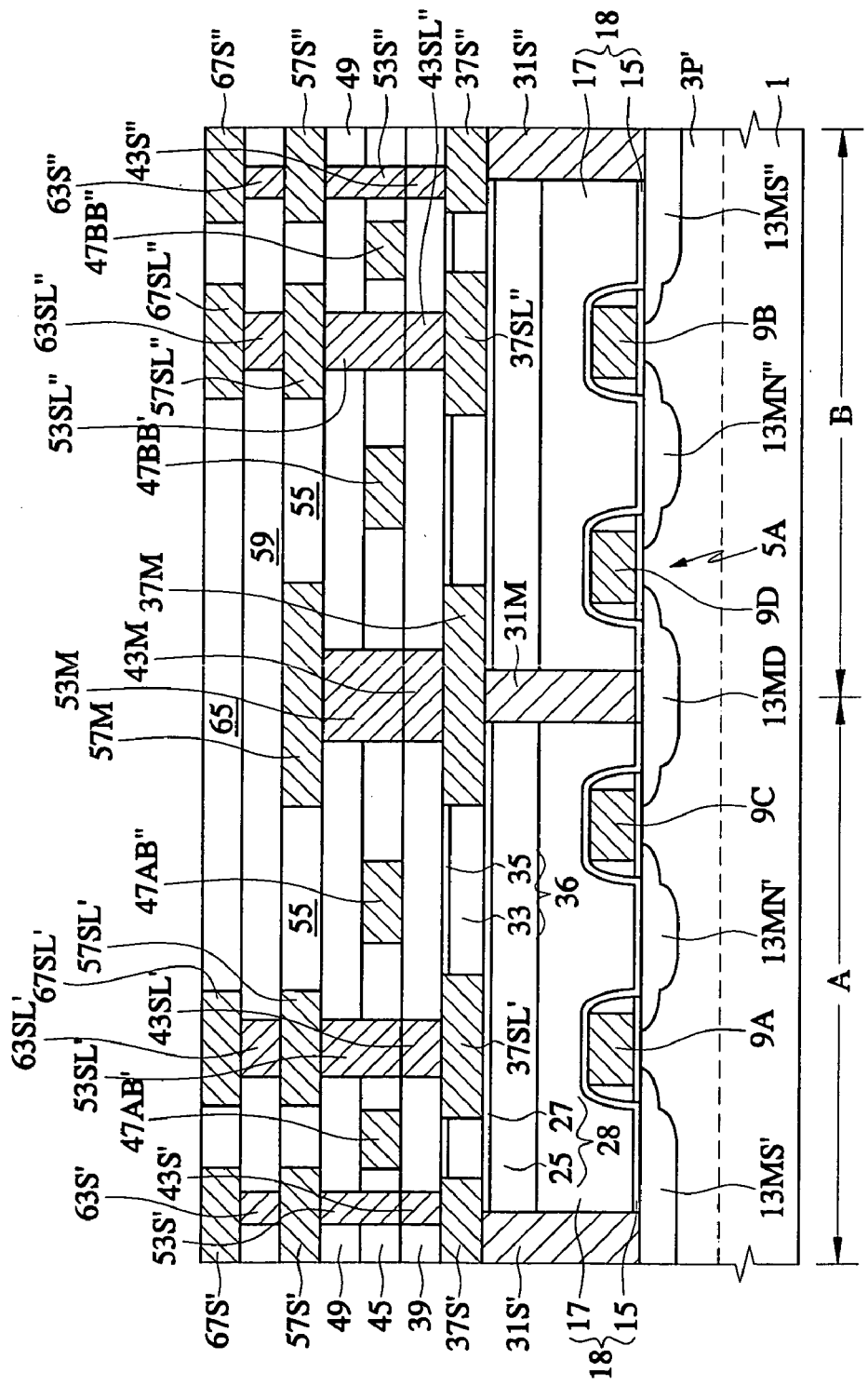
FIGS. 16A and 16B are cross-sectional views, taken along the lines I—I and II—II of FIG. 9 respectively, to illustrate methods of fabricating a ternary CAM cell according to embodiments of the present invention.
Figure 16B:
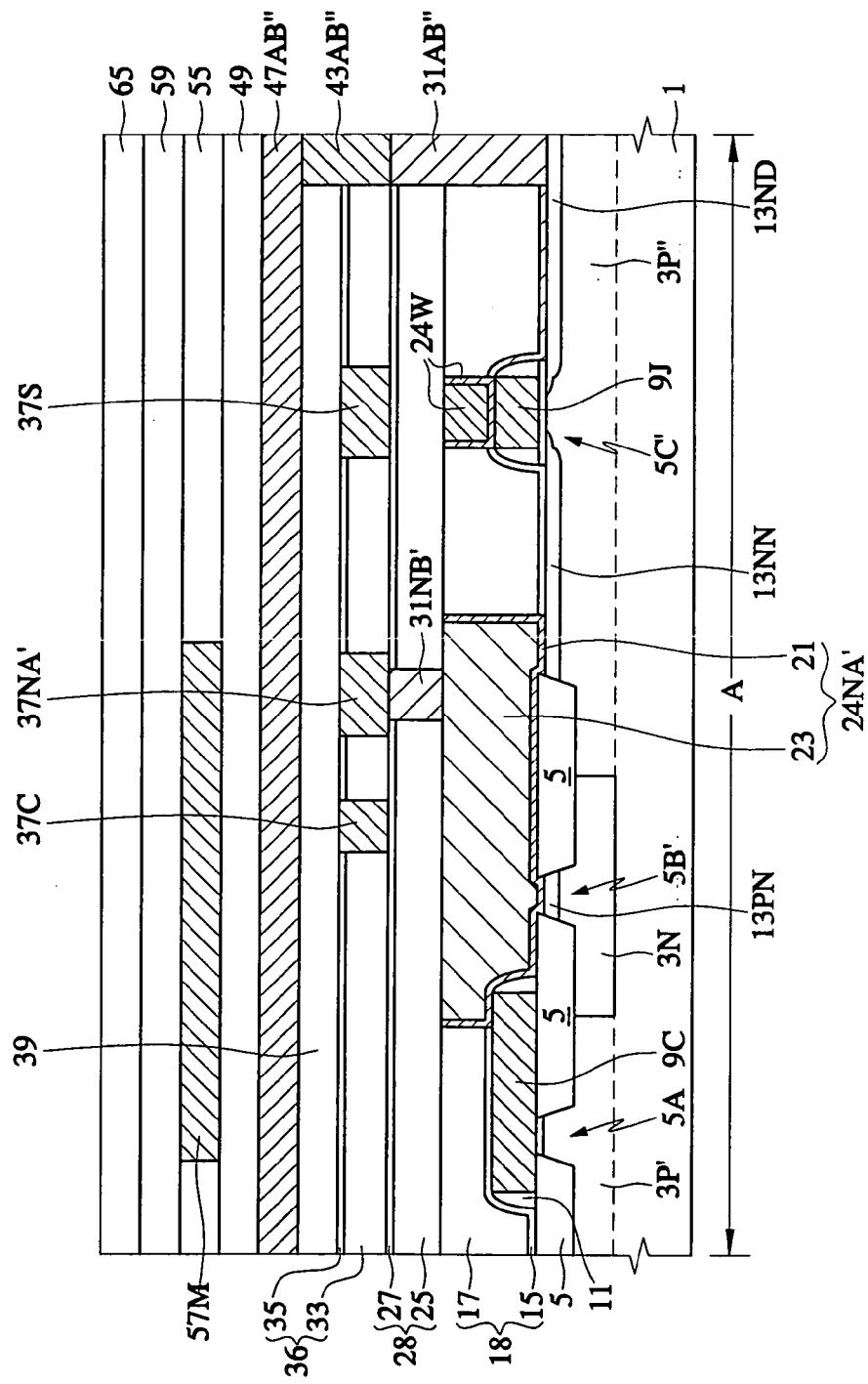

Referring to FIGS. 9, 16A and 16B, an eighth interlayer insulating layer 59 is formed on the semiconductor substrate having the upper ground pads 57S' and 57S", the upper search line pads 57SL' and 57SL", and the match line 57M. The eighth interlayer insulating layer 59 is patterned to form fourth contact holes. The fourth contact holes include first and second search line contact holes 61S' and 61S" formed to expose the first and second upper search line pads 57SL' and 57SL" respectively, and first and second match cell ground line contact holes 61S' and 61S" formed to expose the first and second upper ground pads 57S' and 57S" respectively. Fourth contact plugs are then formed in the fourth contact holes. The fourth contact plugs are formed of a ninth conductive layer. The fourth contact plugs include first and second search line contact plugs 63SL' and 63SL" formed in the first and second search line contact holes 61S' and 61S" respectively, and first and second match cell ground line contact plugs 63S' and 63S" formed in the first and second match cell ground line contact holes 61S' and 61S" respectively.

A ninth interlayer insulating layer 65 is formed on the semiconductor substrate where the fourth contact plugs are formed. First and second search lines 67SL' and 67SL" as well as first and second match cell ground lines 67S' and 67S" are formed in the ninth interlayer insulating layer 65 using a damascene process. The match cell ground lines 67S' and 67S" and the search lines 67SL' and 67SL" are formed of a tenth conductive layer. The first and second match cell ground lines 67S' and 67S" are formed to contact the first and second match cell ground line contact plugs 63S' and 63S" respectively, and the first and second search lines 67SL' and 67SL" are formed to contact the first and second search line contact plugs 63SL' and 63SL" respectively.

Figure 17:
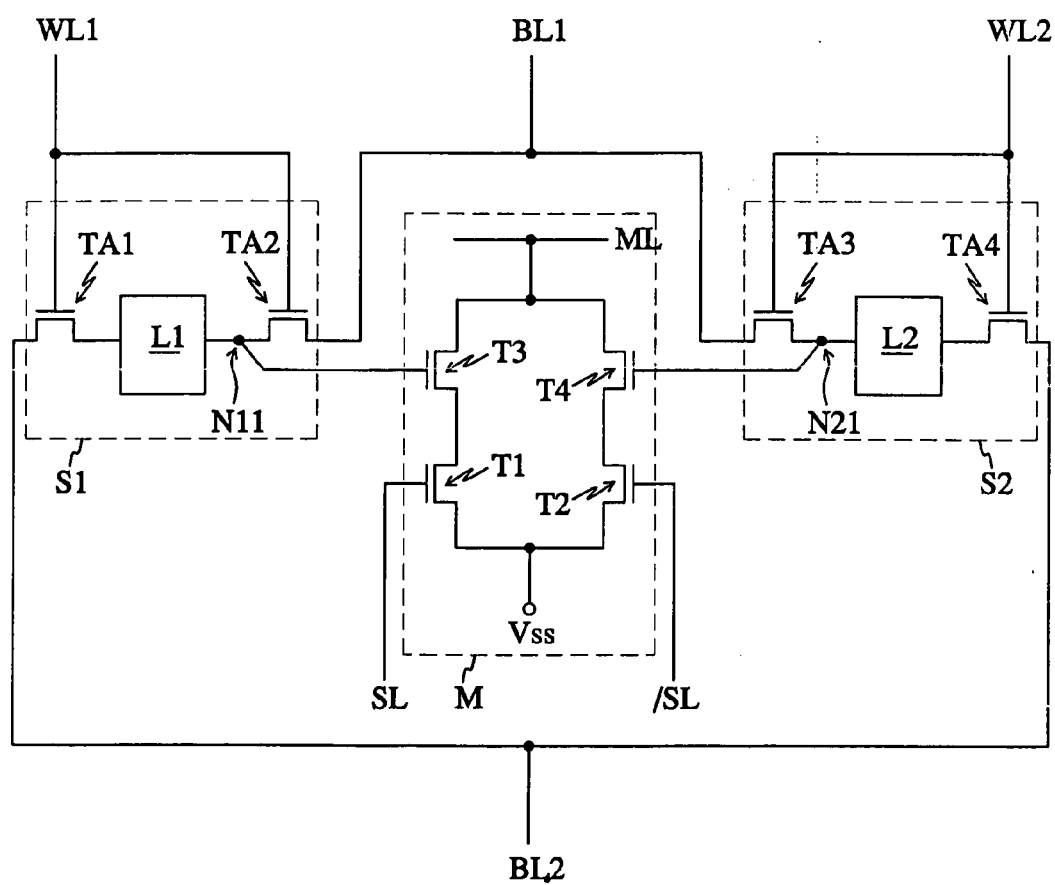
FIG. 17 is an equivalent circuit diagram illustrating a ternary CAM cell according to other embodiments of the present invention.

FIG. 17 is an equivalent circuit diagram illustrating a ternary CAM cell according to another embodiment of the present invention. The ternary CAM cell according to this embodiment is different from the ternary CAM cell shown in FIG. 2 in the organization of word lines and bit lines.

Referring to FIG. 17, the ternary CAM cell according to this embodiment also includes a match cell M and a pair of storage cells S1 and S2. Each of the storage cells S1 and S2 may be a typical SRAM cell as shown in FIG. 2. That is, the first SRAM cell S1 includes a first latch circuit L1, and first and second access transistors TA1 and TA2 connected to a pair of storage nodes of the first latch circuit L1 respectively. Similarly, the second SRAM cell S2 includes a second latch circuit L2, and first and second access transistors TA3 and TA4 connected to a pair of storage nodes of the second latch circuit L2 respectively.

The gate electrodes of the first and second access transistors TA1 and TA2 of the first SRAM cell S1 are electrically connected to a first word line WL1, and the gate electrodes of the first and second access transistors TA3 and TA4 of the second SRAM cell S2 are electrically connected to a second word line WL2. As a result, the ternary CAM cell according to this embodiment has a pair of split word lines, unlike the ternary CAM cell shown in FIG. 2.

Furthermore, the drain region of the second access transistor TA2 in the first SRAM cell S1 and the drain region of the first access transistor TA3 in the second SRAM cell S2 are electrically connected to a first bit line BL1, and the drain region of the first access transistor TA1 in the first SRAM cell S1 and the drain region of the second access transistor TA4 in the second SRAM cell S2 are electrically connected to a second bit line BL2. That is, the ternary CAM cell of this embodiment has a pair of bit lines unlike the ternary CAM cell shown in FIG. 2. Nevertheless, desired data can be stored in the respective storage nodes of the first and second SRAM cells. For example, if signals corresponding to a logic "1 (high level)" and a logic "0 (low level)" are applied to the first and second bit lines BL1 and BL2 respectively and signals corresponding to a logic "1" and a logic "0" are applied to the first and second word lines WL1 and WL2 respectively, information corresponding to a logic "1" is selectively stored in the storage node N11 (the first storage node of the first SRAM cell S1) connected to the source region of the second access transistor TA2. Also, if signals corresponding to a logic "1" and a logic "0" are applied to the first and second bit lines BL1 and BL2 respectively and a signal corresponding to a logic "1" is applied to the first and second word lines WL1 and WL2, information corresponding to a logic "1" is stored in the storage node N21 (the first storage node of the second SRAM cell S2) connected to the source region of the first access transistor TA3 as well as the first node N11.

The match cell M includes first to fourth transistors T1, T2, T3 and T4, like the embodiment shown in FIG. 2. That is, the first and third transistors T1 and T3 are serially connected, and the second and fourth transistors T2 and T4 are also serially connected. The source regions of the first and second transistors T1 and T2 are electrically connected to a ground line Vss, and the drain regions of the third and fourth transistors T3 and T4 are electrically connected to a match line ML. The match line ML may be pre-charged in a standby mode. In this case, the match line ML has a logic high level in the standby mode.

The gate electrodes of the third and fourth transistors T3 and T4 are electrically connected to the first storage node N11 of the first SRAM cell S1 and the first storage node N21 of the second SRAM cell S2 respectively. That is, the gate electrode of the third transistor T3 corresponds to a first node gate electrode, and the gate electrode of the fourth transistor T4 corresponds to a second node gate electrode.

The gate electrodes of the first and second transistors T1 and T2 are electrically connected to first and second search lines SL and /SL respectively. As a result, the gate electrode of the first transistor T1 corresponds to a first search gate electrode, and the gate electrode of the second transistor T2 corresponds to a second search gate electrode. The first search line SL has the logically opposite data to the second search line /SL.

Now, structures of the ternary CAM cell shown in FIG. 17 will be described.

FIGS. 18 to 22 are top plan views illustrating the ternary CAM cell of FIG. 17, which is formed in a semiconductor substrate. In the drawings, the regions indicated by reference characters "C" and "D" represent first and second half cell regions respectively.

Figure 18:
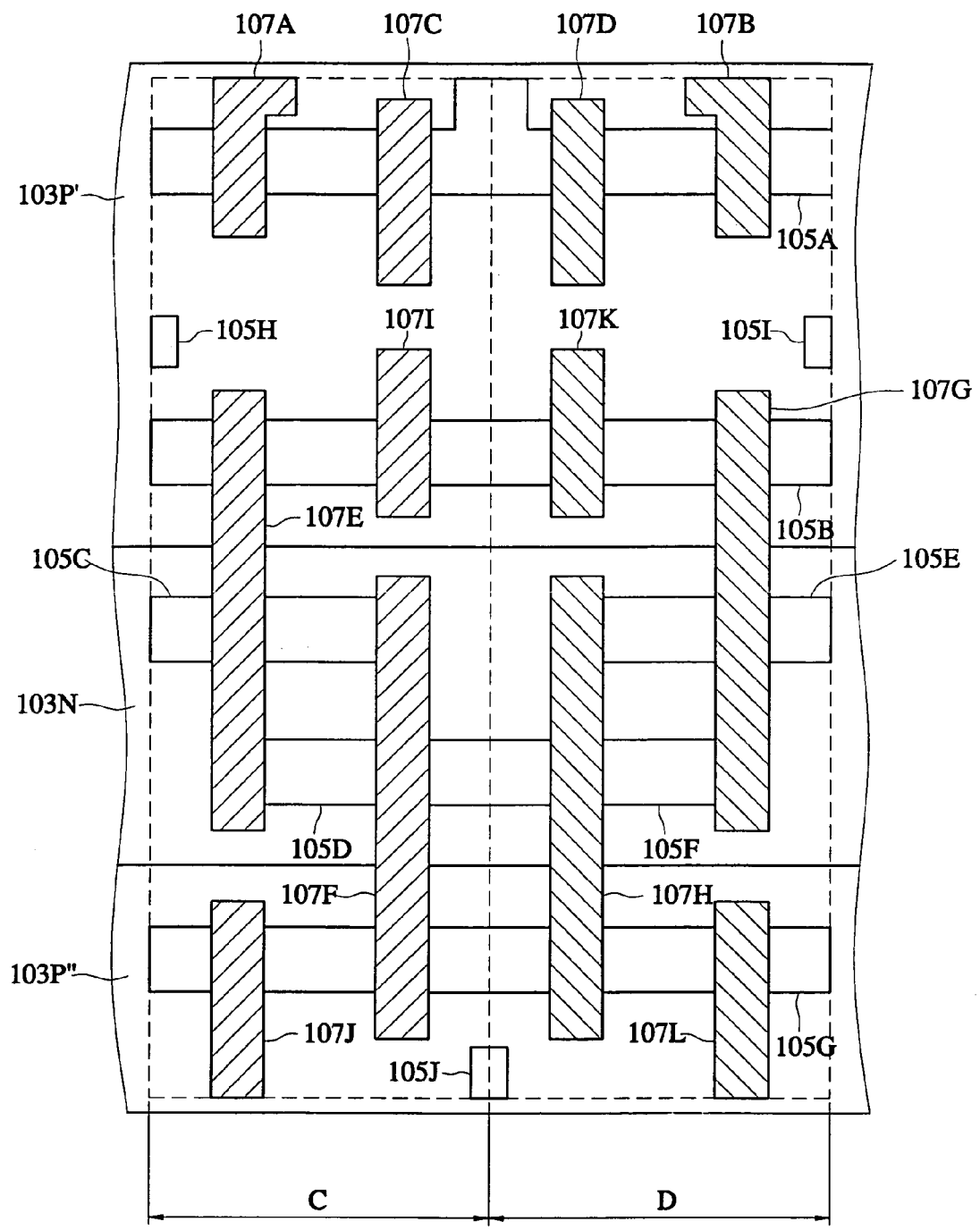
FIG. 18 is a top plan view illustrating active regions and gate electrodes of the ternary CAM cell of FIG. 17.

Referring to FIG. 18, a match cell active region 105A is provided at a semiconductor substrate having the first and second half cell regions C and D. The match cell active region 105A is disposed across the first and second half cell active regions C and D. A first driver/access transistor active region 105B is disposed to be parallel with the match cell active region 105A. The first driver/access transistor active region 105B is also disposed across the first and second half cell regions C and D. The match cell active region 105A and the first driver/access transistor active region 105B may be located in a first P-well 103P'.

A second driver/access transistor active region 105G is placed to be parallel with the first driver/access transistor active region 105B. The second driver/access transistor active region 105G may be disposed in a second P-well 103P'', which is spaced apart from the first P-well 103P', and the second driver/access transistor active region 105G is also placed to cross the first and second half cell regions C and D.

An N-well 103N is placed between the first and second P-wells 103P' and 103P''. A pair of first load transistor active regions 105C and 105E are respectively disposed in the first and second half cell regions C and D inside the N-well 103N. The first load transistor active regions 105C and 105E are spaced apart from each other, and adjacent to the first driver/access transistor active region 105B. Further, a pair of second load transistor active regions 105D and 105F are placed between the first load transistor active regions 105C and 105E and the second driver/access transistor active region 105G. The second load transistor active regions 105D and 105F are also placed in the N-well 103N. The second load transistor active regions 105D and 105F may be connected to each other at the boundary region between the first and second half cell regions C and D.

A pair of first P-well bias active regions 105H and 105I may be provided to be adjacent to both ends of the first driver/access transistor active region 105B respectively. In addition, a second P-well bias active region 105J may be provided to be adjacent to the center of the second driver/access transistor active region 105G. The second P-well bias active region 105J is located opposite the second load transistor active regions 105D and 105F. The first P-well bias active regions 105H and 105I are placed in the first P-well 103P', and the second P-well bias active region 105J is placed in the second P-well 103P''.

First and second parallel search gate electrodes 107A and 107B are disposed to cross over the match cell active region 105A. The first and second search gate electrodes 107A and 107B are placed in the first and second half cell regions C and D respectively. In addition, first and second node gate electrodes 107C and 107D are disposed to cross over the match cell active region 105A between the first and second search gate electrodes 107A and 107B. The first and second node gate electrodes 107C and 107D are placed in the first and second half cell regions C and D respectively.

A first common gate electrode 107E is provided to cross over the first driver/access transistor active region 105B and the first load transistor active region 105C in the first half cell region C. The first common gate electrode 107E may be extended to overlap with one end of the second load transistor active region 105D adjacent to the first load transistor active region 105C. Further, a second common gate electrode 107F is provided to cross over the second driver/access transistor active region 105G and the second load transistor active region 105D in the first half cell region C. The second common gate electrode 107F may also be extended to overlap with one end of the first load transistor active region 105C adjacent to the second load transistor active region 105D. The first common gate electrode 107E may be placed on a line extended from the first search gate electrode 107A, and the second common gate electrode 107F may be placed on a line extended from the first node gate electrode 107C. Further, a first access gate electrode 107I, which is parallel with the first common gate electrode 107E, is provided to cross over the first driver/access transistor active region 105B in the first half cell region C, and a second access gate electrode 107J, which is parallel with the second common gate electrode 107F, is provided to cross over the second driver/access transistor active region 105G in the first half cell region C.

As a result, a first driver transistor and a first access transistor, which are serially connected, are provided at the first driver/access transistor active region 105B, and a second driver transistor and a second access transistor, which are serially connected, are provided at the second driver/access transistor active region 105G. Also, first and second load transistors are provided at the first and second load transistor active regions 105C and 105D respectively.

Similarly, gate electrodes 107G, 107H, 107K and 107L that correspond to the gate electrodes 107E, 107F, 107I and 107J in the first half cell region C are provided in the second half cell region D. The gate electrodes 107G, 107H, 107K and 107L in the second half cell region D may be respectively symmetric with the gate electrodes 107E, 107F, 107I and 107J in the first half cell region C with respect to a straight line crossing the center of the match cell active region 105A.

Figure 19:
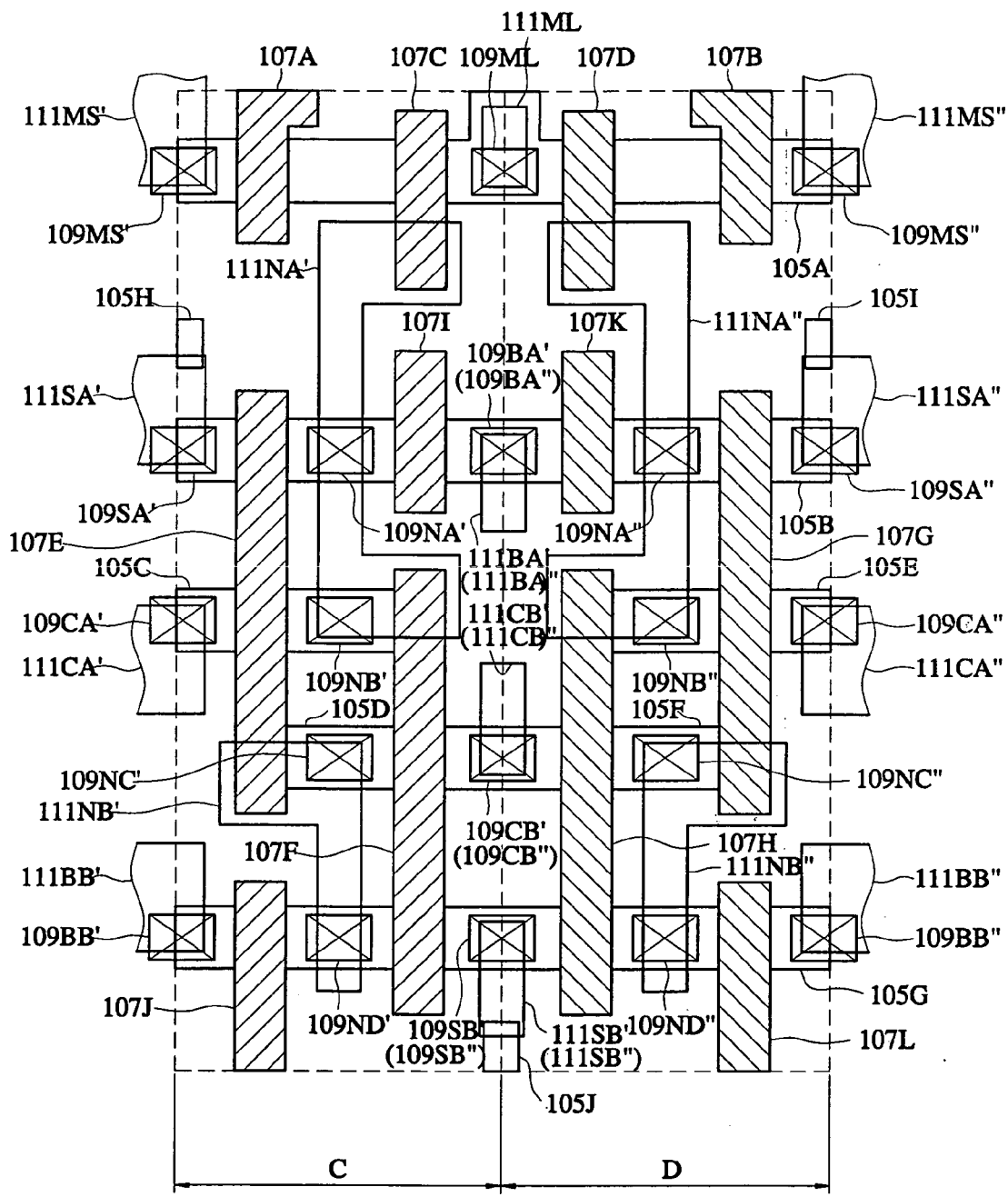
FIG. 19 is a top plan view illustrating active contact holes, lower pads and local interconnections of the ternary CAM cell of FIG. 17.

Referring to FIG. 19, the semiconductor substrate having the gate electrodes is covered with a first interlayer insulating layer. The match cell active region 105A, which is adjacent to the first search gate electrode 107A and is located opposite the first node gate electrode 107C, is exposed by a first lower match cell ground pad contact hole 109MS' that penetrates the first interlayer insulating layer 107C. The first lower match cell ground pad contact hole 109MS' is covered with a first lower match cell ground pad 111MS'. As a result, the first lower match cell ground pad 111MS' is electrically connected to the match cell active region 105A, which is adjacent to the first search gate electrode 107A and is located opposite the first node gate electrode 107C, through the first lower match cell ground pad contact hole 109MS'. Similarly, the match cell active region 105A, which is adjacent to the second search gate electrode 107B and is located opposite the second node gate electrode 107D, is exposed by a second lower match cell ground pad contact hole 109MS'' that penetrates the first interlayer insulating layer. The second lower match cell ground pad contact hole 109MS'' is covered with a second lower match cell ground pad 111MS''. As a result, the second lower match cell ground pad 111MS'' is electrically connected to the match cell active region 105A, which is adjacent to the second search gate electrode 107B and is located opposite the second node gate electrode 107D, through the second lower match cell ground pad contact hole 109MS''.

Further, the match cell active region 105A between the first and second node gate electrodes 107C and 107D is exposed by a lower match line pad contact hole 109ML that penetrates the first interlayer insulating layer. The lower match line pad contact hole 109ML is covered with a lower match line pad 111ML. As a result, the lower match line pad 111ML is electrically connected to the match cell active region 105A between the first and second node gate electrodes 107C and 107D through the lower match line pad contact hole 109ML.

The first driver/access transistor active region 105B, which is adjacent to the first common gate electrode 107E and is located opposite the first access gate electrode 107I, is exposed by a first SRAM cell ground pad contact hole 109SA' that penetrates the first interlayer insulating layer. Similarly, the first driver/access transistor active region 105B, which is adjacent to the first common gate electrode 107G and is located opposite the first access gate electrode 107K, is exposed by another first SRAM cell ground pad contact hole 109SA'' that penetrates the first interlayer insulating layer. The first SRAM cell ground pad contact holes 109SA' and 109SA" are covered with first SRAM cell ground pads 111SA' and 111SA". In this case, the first SRAM cell ground pads 111SA' and 111SA" may be extended to overlap with edges of the first P-well bias active regions 105H and 105I respectively.

The first driver/access transistor active region 105B between the first access gate electrodes 107I and 107K is exposed by a first bit line pad contact hole 109BA' or 109BA" that penetrates the first interlayer insulating layer. The first bit line pad contact hole 109BA' or 109BA" is covered with a first bit line pad 111BA' or 111BA".

The first node gate electrode 107C is electrically connected to the second common gate electrode 107F in the first half cell region C through a first node line 111NA'. Further, the first node line 111NA' is electrically connected to the first driver/access transistor active region 105B between the first common gate electrode 107E and the first access gate electrode 107I, through a first node contact hole 109NA'. In addition, the first node line 111NA' is electrically connected to the first load transistor active region 105C adjacent to the first common gate electrode 107E, through a second node contact hole 109NB'. The first common gate electrode 107E is electrically connected to a first local interconnection 111NB'. The first local interconnection 111NB' is electrically connected to the second load transistor active region 105D adjacent to the second common gate electrode 107F through a third node contact hole 109NC', and is electrically connected to the second driver/access transistor active region 105G between the second common gate electrode 107F and the second access gate electrode 107J through a fourth node contact hole 109ND'. As a result, a first latch circuit (L1 of FIG. 17) is realized in the first half cell region C. Accordingly, a first SRAM cell is provided in the first half cell region C.

Similarly, the second node gate electrode 107D is electrically connected to the second common gate electrode 107H in the second half cell region D, through a second node line 111NA". The second node line 111NA" is electrically connected to the first driver/access transistor active region 105B between the first common gate electrode 107G and the first access gate electrode 107K, through a first node contact hole 109NA". Also, the second node line 111NA" is electrically connected to the first load transistor active region 105E adjacent to the first common gate electrode 107G, through a second node contact hole 109NB". In the meantime, the first common gate electrode 107G is electrically connected to a second local interconnection 111NB". The second local interconnection 111NB" is electrically connected to the second load transistor active region 105F adjacent to the second common gate electrode 107H through a third node contact hole 109NC", and is electrically connected to the second driver/access transistor active region 105G between the second common gate electrode 107H and the second access gate electrode 107L through a fourth node contact hole 109ND". As a result, a second latch circuit (L2 of FIG. 17) is realized in the second half cell region D. That is, a second SRAM cell is provided in the second half cell region D.

The first load transistor active region 105C, which is adjacent to the first common gate electrode 107E and is located opposite the second node contact hole 109NB', is exposed by a first power line pad contact hole 109CA' that penetrates the first interlayer insulating layer, and the first load transistor active region 105E, which is adjacent to the first common gate electrode 107G and is located opposite the second node contact hole 109NB", is exposed by another first power line pad contact hole 109CA" that penetrates the first interlayer insulating layer. The first power line pad contact holes 109CA' and 109CA" are covered with first power line pads 111CA' and 111CA" respectively. The second load transistor active regions 105D and 105F between the second common gate electrodes 107F and 107H are exposed by a second power line pad contact hole 109CB' or 109CB" that penetrates the first interlayer insulating layer. The second power line pad contact hole 109CB' or 109CB" is covered with a second power line pad 111CB' or 111CB".

The second driver/access transistor active region 105G, which is adjacent to the second access gate electrode 107J and is located opposite to the second common gate electrode 107F, is exposed by a second bit line pad contact hole 109BB' that penetrates the first interlayer insulating layer, and the second bit line pad contact hole 109BB' is covered with a second bit line pad 111BB'. Similarly, the second driver/access transistor active region 105G, which is adjacent to the second access gate electrode 107L and is located opposite the second common gate electrode 107H, is exposed by another second bit line pad contact hole 109BB" that penetrates the first interlayer insulating layer, and the second bit line pad contact hole 109BB" is covered with another second bit line pad 111BB".

Furthermore, the second driver/access transistor active region 105G between the second common gate electrodes 107F and 107H is exposed by a second SRAM cell ground pad contact hole 109SB' or 109SB" that penetrates the first interlayer insulating layer, and the second SRAM cell ground pad contact hole 109SB' or 109SB" is covered with a second SRAM cell ground pad 111SB' or 111SB". The second SRAM cell ground pad 111SB' or 111SB" may be extended to overlap with a portion of the second P-well bias active region 105J.

The pads, the node lines and the local interconnections may be placed in a second interlayer insulating layer stacked on the first interlayer insulating layer.

Figure 20:
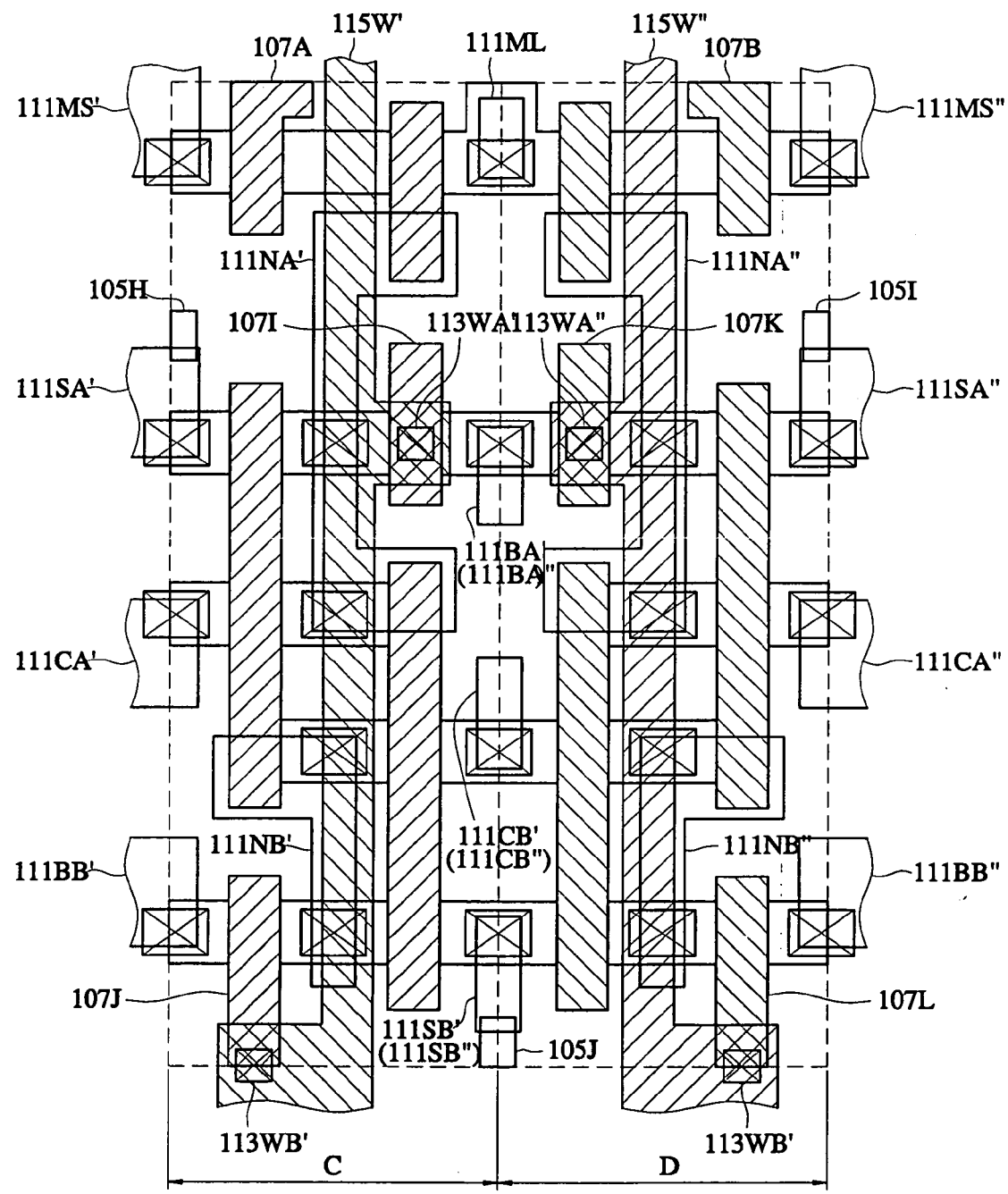
FIG. 20 is a top plan view illustrating word lines of the ternary CAM cell of FIG. 17.

Referring to FIG. 20, the semiconductor substrate having the pads, the node lines and the local interconnections is covered with a third interlayer insulating layer. The first and second access gate electrodes 107I and 107J in the first half cell region C are electrically connected to a first word line 115W' through first word line contact holes 113WA' and 113WB' that penetrate the second and third interlayer insulating layers. The first word line 115W' is disposed to cross over the active regions. Similarly, the first and second access gate electrodes 107K and 107L in the second half cell region D are electrically connected to a second word line 115W" through second word line contact holes 113WA" and 113WB" that penetrate the second and third interlayer insulating layers. The second word line 115W" is disposed to be parallel with the first word line 115W'. The word lines 115W' and 115W" may be placed in a fourth interlayer insulating layer stacked on the third interlayer insulating layer.

Figure 21:
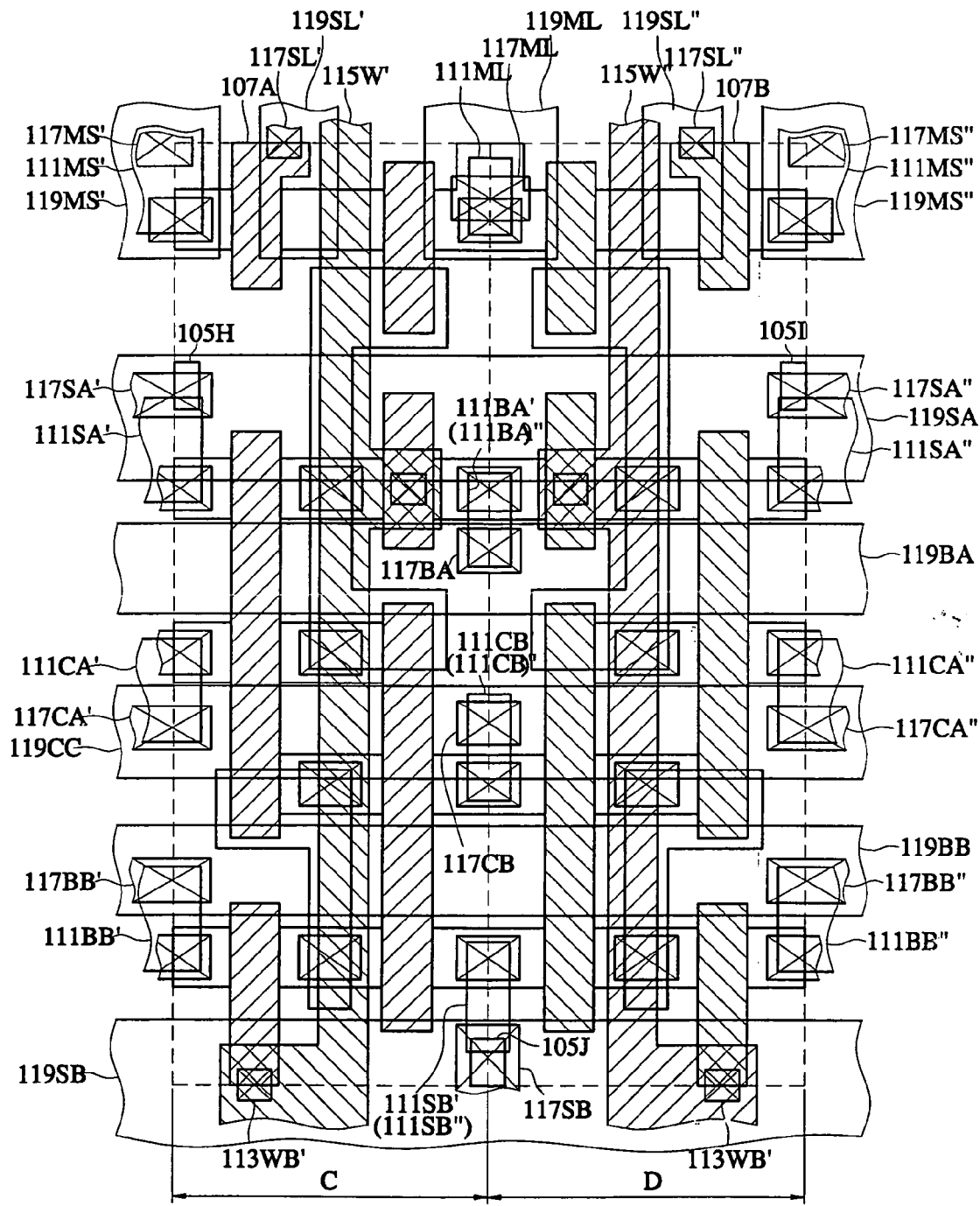
FIG. 21 is a top plan view illustrating upper pads, a power line, ground lines and bit lines of the ternary CAM cell of FIG. 17.

Referring to FIG. 21, the fourth interlayer insulating layer and the word lines 115W' and 115W" are covered with a fifth interlayer insulating layer. The first lower match cell ground pad 111MS' is exposed by a first upper match cell ground pad contact hole 117MS' penetrating the third to fifth interlayer insulating layers, and the first upper match cell ground pad contact hole 117MS' is covered with a first upper match cell ground pad 119MS'. Further, the second lower match cell ground pad 111MS" is exposed by a second upper match cell ground pad contact hole 117MS" penetrating the third to fifth interlayer insulating layers, and the second upper match cell ground pad contact hole 117MS" is covered with a second upper match cell ground pad 119MS". Further, the first search gate electrode 107A is exposed by a first search line pad contact hole 117SL' penetrating the second to fifth interlayer insulating layers, and the first search line pad contact hole 117SL' is covered with a first search line pad 119SL'. Similarly, the second search gate electrode 107B is exposed by a second search line pad contact hole 117SL" penetrating the second to fifth interlayer insulating layers, and the second search line pad contact hole 117SL" is covered with a second search line pad 119SL". The lower match line pad 111MS is exposed by an upper match line pad contact hole 117ML penetrating the third to fifth interlayer insulating layers, and the upper match line pad contact hole 117ML is covered with an upper match line pad 119ML.

The first SRAM cell ground pad 111SA' and the first P-well bias active region 105H in the first half cell region C are exposed by a first SRAM cell ground line contact hole 117SA' penetrating the first to fifth interlayer insulating layers, and the first SRAM cell ground pad 111SA" and the first P-well bias active region 105I in the second half cell region D are exposed by another first SRAM cell ground line contact hole 117SA" penetrating the first to fifth interlayer insulating layers. That is, the first SRAM cell ground line contact holes 117SA' and 117SA" may be butted contact holes. The first SRAM cell ground line contact holes 117SA' and 117SA" are covered with a first SRAM cell ground line 119SA that crosses over the word lines 115W', 115W".

The first bit line pad 111BA' or 111BA" is exposed by a first bit line contact hole 117BA penetrating the third to fifth interlayer insulating layers, and the first bit line contact hole 117BA is covered with a first bit line 119BA crossing over the word lines 115W' and 115W". Also, the first power line pads 111CA' and 111CA" are respectively exposed by first power line contact holes 117CA' and 117CA" that penetrate the third to fifth interlayer insulating layers, and the second power line pad 111CB' or 111CB" is exposed by a second power line contact hole 117CB that penetrates the third to fifth interlayer insulating layers. The 1first and second power line contact holes 117CA', 117CA" and 117CB are covered with a power line 119CC that crosses over the word lines 115W' and 115W".

Moreover, the second bit line pads 111BB' and 111BB" are respectively exposed by second bit line contact holes 117BB' and 117BB" that penetrate the third to fifth interlayer insulating layers, and the second bit line contact holes 117BB' and 117BB" are covered with a second bit line 119BB that crosses over the word lines 115W' and 115W". The second SRAM cell ground pad 111SB' or 111SB" and the second P-well bias active region 105J are exposed by a second SRAM cell ground line contact hole 117SB that penetrates the first to fifth interlayer insulating layers. That is, the second SRAM cell ground line contact hole 117SB may be a butted contact hole. The second SRAM cell ground line contact hole 117SB is covered with a second SRAM cell ground line 119SB crossing over the word lines 115W' and 115W". The power line, the ground lines, the bit lines and the upper pads may be provided in a sixth interlayer insulating layer stacked on the fifth interlayer insulating layer.

Figure 22:
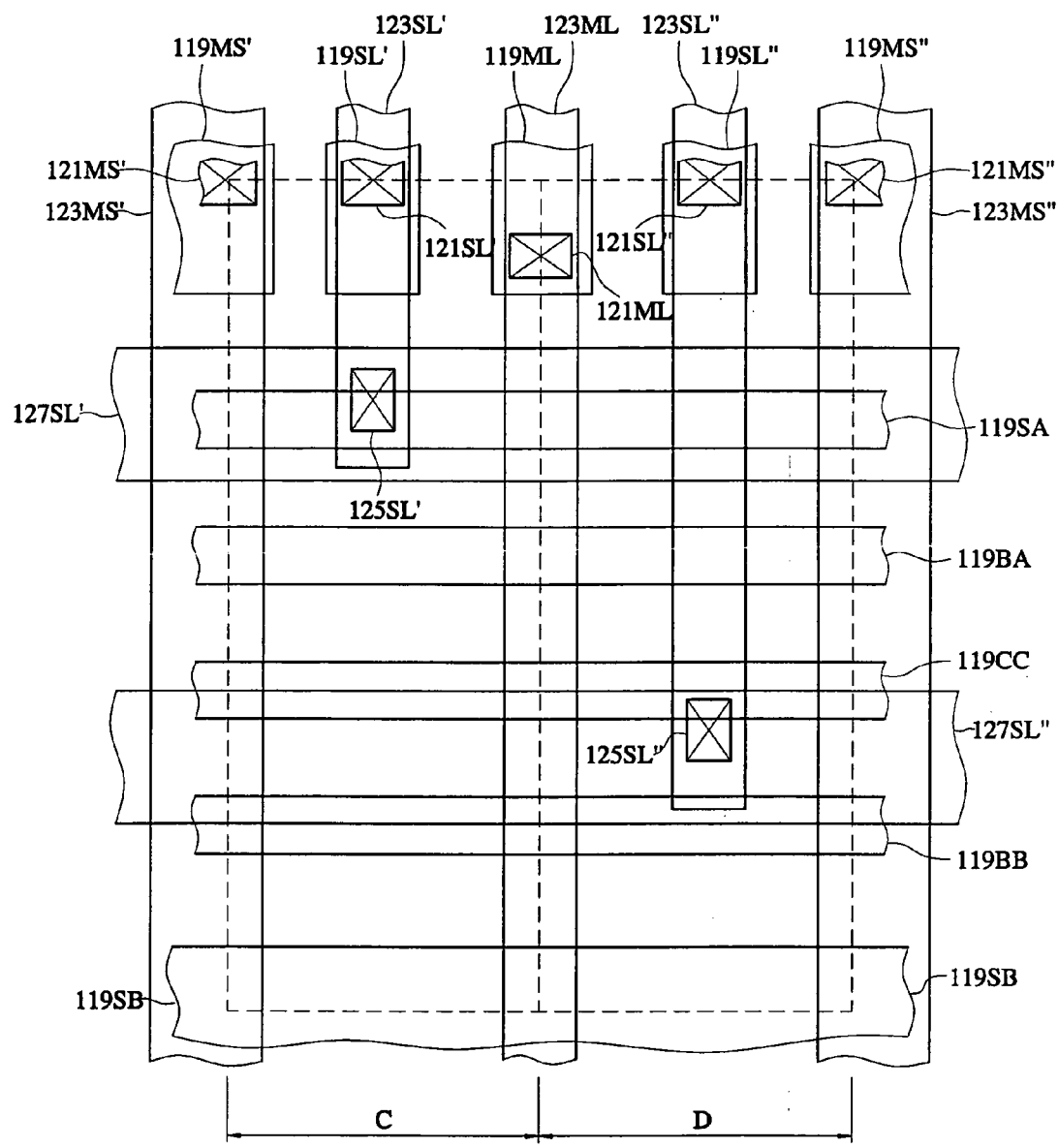
FIG. 22 is a top plan view illustrating match cell ground lines, a match line and search lines of the ternary CAM cell of FIG. 17.

Referring to FIG. 22, the power line, the ground lines, the bit lines, the upper pads and the sixth interlayer insulating layer are covered with a seventh interlayer insulating layer. The first upper match cell ground pad 119MS' is exposed by a first match cell ground line contact hole 121 MS' penetrating the seventh interlayer insulating layer, and the first match cell ground line contact hole 121MS' is covered with a first match cell ground line 123MS' crossing over the bit lines 119BA and 119BB. Similarly, the second upper match cell ground pad 119MS" is exposed by a second match cell ground line contact hole 121MS" penetrating the seventh interlayer insulating layer, and the second match cell ground line contact hole 121MS" is covered with a second match cell ground line 123MS" crossing over the bit lines 119BA, 119BB.

The first search line pad 119SL' is exposed by a first sub-search line contact hole 121 SL' penetrating the seventh interlayer insulating layer, and the first sub-search line contact hole 121SL' is covered with a first sub-search line 123SL' which is parallel with the first match cell ground line 123MS'. Further, the second search line pad 119SL" is exposed by a second sub-search line contact hole 121SL" penetrating the seventh interlayer insulating layer, and the second sub-search line contact hole 121 SL" is covered with a second sub-search line 123SL" which is parallel with the second match cell ground line 123MS". Further, the upper match line pad 119ML is exposed by a match line contact hole 121ML penetrating the seventh interlayer insulating layer, and the match line contact hole 121ML is covered with a match line 123ML which is parallel with the sub-search lines 123SL' and 123SL". The match cell ground lines 123MS' and 123MS", the sub-search lines 123SL' and 123SL", and the match line 123ML may be disposed in an eighth interlayer insulating layer stacked on the seventh interlayer insulating layer.

The match cell ground lines 123MS' and 123MS", the sub-search lines 123SL' and 123SL", the match line 123ML and the eighth interlayer insulating layer are covered with a ninth interlayer insulating layer. A predetermined region of the first sub-search line 123SL' is exposed by a first search line contact hole 125SL' penetrating the ninth interlayer insulating layer, and the first search line contact hole 125SL' is covered with a first search line 127SL' crossing over the first sub-search line 123SL'. Similarly, a predetermined region of the second sub-search line 123SL" is exposed by a second search line contact hole 125SL" penetrating the ninth interlayer insulating layer, and the second search line contact hole 125SL" is covered with a second search line 127SL" crossing over the second sub-search line 123SL".

As described above, according to embodiments of the present invention, the first node gate electrode adjacent to the match cell drain region is electrically connected to either one of the storage nodes in the first storage cell through the first node line, and the second node gate electrode adjacent to the match cell drain region is electrically connected to either one of the storage nodes in the second storage cell through the second node line. In addition, the first and second storage cells are realized using SRAM cells having compact layout. Therefore, a ternary CAM cell having a stable operation and a high integration density can be realized.

Particular embodiments of the invention are described without limitation.

In accordance with another aspect of the present invention, the ternary CAM cell includes a pair of half cells. Each of the half cells includes an isolation layer formed at a predetermined region of a semiconductor substrate. The isolation layer defines first and second active regions spaced apart from each other and a third active region located between the first and second active regions. First and second gate electrodes are disposed to cross over the first active region. Cell transistors are provided at the second and third active regions. The cell transistors constitute a storage cell, that is, a single SRAM cell. In this case, two driver transistors and two access transistors are provided at the second active region, and two load transistors are provided at the third active region. A match line is electrically connected to the first active region that is adjacent to the second gate electrode and is located opposite the first gate electrode. The second gate electrode is electrically connected to one of a pair of storage nodes of the SRAM cell through a node line.

In accordance with still another aspect of the present invention, the ternary CAM cell includes a semiconductor substrate having a first half cell region and a second half cell region. A match cell active region is disposed across the first and second half cell regions. First and second search gate electrodes are placed to cross over the match cell active region. The first and second search gate electrodes are provided in the first and second half cell regions respectively. First and second node gate electrodes are disposed to cross over the match cell active region between the first and second search gate electrodes. The first and second node gate electrodes are located in the first and second half cell regions respectively. The match cell active region between the first and second node gate electrodes is electrically connected to a match line. A first SRAM cell is provided at the semiconductor substrate in the first half cell region. Similarly, a second SRAM cell is provided at the semiconductor substrate in the second half cell region. The first node gate electrode is electrically connected to one of a pair of storage nodes of the first SRAM cell through a first node line. Also, the second node gate electrode is electrically connected to one of a pair of storage nodes of the second SRAM cell through a second node line.

In some embodiments, the match cell active region between the first and second node gate electrodes may be electrically connected to a match line pad disposed under the match line. In this case, a lower interlayer insulating layer, a middle interlayer insulating layer and an upper interlayer insulating layer may be sequentially stacked between the match line and the match line pad.

In other embodiments, the match line pad may be in contact with a lower match line contact plug that penetrates the lower interlayer insulating layer, and the lower match line contact plug may be in contact with an upper match line contact plug that penetrates the middle interlayer insulating layer and the upper interlayer insulating layer. In addition, first and second bit lines may be located at both sides of the upper match line contact plug respectively. The first and second bit lines may be disposed in the middle interlayer insulating layer.

In accordance with still yet another aspect of the present invention, the ternary CAM cell includes a semiconductor substrate having a first half cell region and a second half cell region. A match cell active region is disposed across the first and second half cell regions. First and second search gate electrodes are placed to cross over the match cell active region. The first and second search gate electrodes are located in the first and second half cell regions respectively. First and second node gate electrodes are provided to cross over the match cell active region between the first and second search gate electrodes. The first and second node gate electrodes are located in the first and second half cell regions respectively. First and second driver/access transistor active regions are provided in the first and second half cell regions respectively. A first load transistor active region is placed in the first half cell region between the match cell active region and the first driver/access transistor active region. Similarly, a second load transistor active region is placed in the second half cell region between the match cell active region and the second driver/access transistor active region. The match cell active region between the node gate electrodes is electrically connected to a match line. First and second access transistors as well as first and second driver transistors are provided at the first driver/access transistor active region, and first and second load transistors are provided at the first load transistor active region. The first and second driver transistors, the first and second access transistors, and the first and second load transistors constitute a first SRAM cell. Similarly, third and fourth access transistors as well as third and fourth driver transistors are provided at the second driver/access transistor active region, and third and fourth load transistors are provided at the second load transistor active region. The third and fourth driver transistors, the third and fourth access transistors, and the third and fourth load transistors constitute a second SRAM cell. The first node gate electrode is electrically connected to one of a pair of storage nodes of the first SRAM cell through a first node line, and the second node gate electrode is electrically connected to one of a pair of storage nodes of the second SRAM cell through a second node line.

In accordance with further aspect of the present invention, the ternary CAM cell includes a pair of half cells, and each of the half cells includes a match cell active region and a first N-type active region that are defined at a semiconductor substrate. The match cell active region and the first N-type active region are disposed to be parallel with each other. A second N-type active region is placed to be adjacent to the first N-type active region, and the second N-type active region is located opposite the match cell active region. First and second P-type active regions are provided between the first and second N-type active regions, and the first and second P-type active regions are adjacent to the first and second N-type active regions respectively. First and second gate electrodes are disposed to cross over the match cell active region. A first driver transistor and a first access transistor are provided at the first N-type active region, and a second driver transistor and a second access transistor are provided at the second N-type active region. In addition, first and second load transistors are provided at the first and second P-type active regions respectively. The first and second driver transistors, the first and second access transistors, and the first and second load transistors constitute an SRAM cell. A match line is electrically connected to the match cell active region, which is adjacent to the second gate electrode and is located opposite the first gate electrode. The second gate electrode is electrically connected to one of a pair of storage nodes of the SRAM cell through a node line.

In accordance with still further aspect of the present invention, the ternary CAM cell includes a semiconductor substrate having a first half cell region and a second half cell region. The ternary CAM cell further includes a match cell active region disposed across the first and second half cell regions. First and second search gate electrodes are provided to cross over the match cell active region. The first and second search gate electrodes are disposed in the first and second half cell regions respectively. First and second node gate electrodes are provided to cross over the match cell active region between the first and second search gate electrodes. The first and second node gate electrodes are located in the first and second half cell regions respectively. The match cell active region between the first and second node gate electrodes is electrically connected to a match line. A first driver/access transistor active region is disposed across the first and second half cell regions. A second driver/access transistor active region is disposed to be parallel with the first driver/access transistor active region. The second driver/access transistor active region is located opposite the match cell active region. A pair of first load transistor active regions are provided between the first and second driver/access transistor active regions. The pair of first load transistor active regions are located in the first and second half cell regions respectively.

A second load transistor active region is placed between the second driver/access transistor active region and the first load transistor active regions. The second load transistor active region is located across the first and second half cell regions. A first driver transistor and a first access transistor are provided at the first driver/access transistor active region in the first half cell region, and a second driver transistor and a second access transistor are provided at the second driver/access transistor active region in the first half cell region. Also, first and second load transistors are respectively provided at the first and second load transistor active regions in the first half cell region. The first and second driver transistors, the first and second access transistors, and the first and second load transistors, which are located in the first half cell region, constitute a first SRAM cell. Similarly, a first driver transistor and a first access transistor are provided at the first driver/access transistor active region in the second half cell region, and a second driver transistor and a second access transistor are provided at the second driver/access transistor active region in the second half cell region. In addition, first and second load transistors are respectively provided at the first and second load transistor active regions in the second half cell region. The first and second driver transistors, the first and second access transistors, and the first and second load transistors, which are located in the second half cell region, constitute a second SRAM cell.

The first node gate electrode is electrically connected to one of a pair of storage nodes of the first SRAM cell through a first node line. Further, the second node gate electrode is electrically connected to one of a pair of storage nodes of the second SRAM cell through a second node line.

Preferred embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A ternary content addressable memory (CAM) cell having a pair of half cells, each of the half cells comprising:
   an isolation layer formed at a predetermined region of a semiconductor substrate to define a match cell active region;
   a search gate electrode and a node gate electrode crossing over the match cell active region and being spaced apart from each other;
   a match line electrically connected to the match cell active region which is adjacent to the node gate electrode and is located opposite the search gate electrode;
   an SRAM cell formed at the semiconductor substrate adjacent to the match cell active region; and
   a node line electrically connecting the node gate electrode to one of a pair of storage nodes of the SRAM cell.

2. The ternary CAM cell according to claim 1, wherein the pair of the half cells are symmetric with each other with respect to a straight line crossing one end of the match cell active region, and the match cell active regions in the pair of the half cells are connected to each other.

3. The ternary CAM cell according to claim 1, further comprising a match cell ground line electrically connected to the match cell active region which is adjacent to the search gate electrode and is located opposite the node gate electrode.

4. The ternary CAM cell according to claim 1, wherein the match line is disposed to be parallel or perpendicular to the match cell active region.

5. The ternary CAM cell according to claim 3, wherein the match cell ground line is disposed to cross over the match cell active region.

6. The ternary CAM cell according to claim 1, further comprising a search line electrically connected to the search gate electrode.

7. The ternary CAM cell according to claim 6, wherein the search line is disposed to cross over the match cell active region or to be parallel with the match cell active region.

8. A ternary CAM cell having a pair of half cells, each of the half cells comprising:
   an isolation layer formed at a predetermined region of a semiconductor substrate to define first and second active regions spaced apart from each other and a third active region located between the first and second active regions;
   first and second gate electrodes crossing over the first active region and being spaced apart from each other;
   an SRAM cell including two driver transistors and two access transistors formed at the second active region, and two load transistors formed at the third active region;
   a match line electrically connected to the first active region which is adjacent to the second gate electrode and is located opposite the first gate electrode; and
   a node line electrically connecting the second gate electrode to one of a pair of storage nodes of the SRAM cell.

9. The ternary CAM cell according to claim 8, wherein the pair of half cells are symmetric with each other with respect to a straight line crossing one end of the first active region, and the first active regions in the pair of half cells are connected to each other.

10. The ternary CAM cell according to claim 8, further comprising a match cell ground line electrically connected to the first active region which is adjacent to the first gate electrode and is located opposite the second gate electrode.

11. The ternary CAM cell according to claim 8, wherein the match line is disposed to be parallel with the first active region.

12. The ternary CAM cell according to claim 10, wherein the match cell ground line is disposed to cross over the first active region.

13. The ternary CAM cell according to claim 8, further comprising a search line that is located over the first gate electrode and is electrically connected to the first gate electrode.

14. The ternary CAM cell according to claim 13, wherein the search line is placed to cross over the first active region.

15. The ternary CAM cell according to claim 8, wherein the first and second active regions are respectively placed in first and second P-wells that are spaced apart from each other, and the third active region is placed in an N-well between the first and second P-wells.

16. A ternary CAM cell comprising:
   a semiconductor substrate having a first half cell region and a second half cell region;
   a match cell active region disposed across the first and second half cell regions;

first and second search gate electrodes crossing over the match cell active region, the first and second search gate electrodes being placed in the first and second half cell regions respectively;
first and second node gate electrodes crossing over the match cell active region between the first and second search gate electrodes, the first and second node gate electrodes being disposed in the first and second half cell regions respectively;
a match line electrically connected to the match cell active region between the first and second node gate electrodes;
a first SRAM cell formed at the semiconductor substrate in the first half cell region;
a second SRAM cell formed at the semiconductor substrate in the second half cell region;
a first node line electrically connecting the first node gate electrode to one of a pair of storage nodes of the first SRAM cell; and
a second node line electrically connecting the second node gate electrode to one of a pair of storage nodes of the second SRAM cell.

17. The ternary CAM cell according to claim 16, further comprising first and second match cell ground lines electrically connected to both ends of the match cell active region respectively, which are adjacent to the first and second search gate electrodes.

18. The ternary CAM cell according to claim 17, wherein the first and second match cell ground lines are disposed to cross over the match cell active region.

19. The ternary CAM cell according to claim 16, wherein the match line is disposed to be parallel with the match cell active region.

20. The ternary CAM cell according to claim 16, further comprising first and second search lines electrically connected to the first and second search gate electrodes respectively.

21. The ternary CAM cell according to claim 20, wherein the first and second search lines are disposed to cross over the match cell active region.

22. The ternary CAM cell according to claim 16, wherein the first and second search gate electrodes are extended to respectively contact first and second search gate electrodes of another ternary CAM cell located opposite the SRAM cells.

23. The ternary CAM cell according to claim 16, wherein both ends of the match cell active region are extended to respectively contact both ends of a match cell active region of another ternary CAM cell located opposite the SRAM cells.

24. The ternary CAM cell according to claim 16, further comprising:
a match line pad located under the match line and electrically connected to the match cell active region between the first and second node gate electrodes;
a lower interlayer insulating layer, a middle interlayer insulating layer and an upper interlayer insulating layer sequentially stacked between the match line and the match line pad;
a lower match line contact plug penetrating the lower interlayer insulating layer to contact the match line pad;
an upper match line contact plug penetrating the middle interlayer insulating layer and the upper interlayer insulating layer to contact a top surface of the lower match line contact plug and a bottom surface of the match line; and
first and second bit lines placed in the middle interlayer insulating layer and located at both sides of the upper match line contact plug respectively.

25. A ternary CAM cell comprising:
a semiconductor substrate having a first half cell region and a second half cell region;
a match cell active region disposed across the first and second half cell regions;
first and second search gate electrodes crossing over the match cell active region, the first and second search gate electrodes being placed in the first and second half cell regions respectively;
first and second node gate electrodes crossing over the match cell active region between the first and second search gate electrodes, the first and second node gate electrodes being placed in the first and second half cell regions respectively;
first and second driver/access transistor active regions disposed in the first and second half cell regions respectively;
a first load transistor active region disposed in the first half cell region between the match cell active region and the first driver/access transistor active region;
a second load transistor active region disposed in the second half cell region between the match cell active region and the second driver/access transistor active region;
a match line electrically connected to the match cell active region between the first and second node gate electrodes;
a first SRAM cell having first and second load transistors formed at the first load transistor active region as well as first and second driver transistors and first and second access transistors formed at the first driver/access transistor active region;
a second SRAM cell having first and second load transistors formed at the second load transistor active region as well as first and second driver transistors and first and second access transistors formed at the second driver/access transistor active region;
a first node line electrically connecting the first node gate electrode to one of a pair of storage nodes of the first SRAM cell; and
a second node line electrically connecting the second node gate electrode to one of a pair of storage nodes of the second SRAM cell.

26. The ternary CAM cell according to claim 25, wherein the match line is disposed to be parallel with the match cell active region.

27. The ternary CAM cell according to claim 25, wherein both ends of the match cell active region are extended to be respectively in contact with both ends of a match cell active region of another ternary CAM cell located opposite the SRAM cells.

28. The ternary CAM cell according to claim 25, further comprising first and second match cell ground lines electrically connected to ends of the match cell active region respectively, which are adjacent to the first and second search gate electrodes.

29. The ternary CAM cell according to claim 28, wherein the first and second match cell ground lines are disposed to cross over the match cell active regions.

30. The ternary CAM cell according to claim 25, further comprising first and second search lines electrically connected to the first and second search gate electrodes respectively, the first and second search lines being disposed over the first and second search gate electrodes.

31. The ternary CAM cell according to claim 30, wherein the first and second search lines are disposed to cross over the match cell active region.

32. The ternary CAM cell according to claim 25, wherein the first and second load transistor active regions are disposed to be parallel with the match cell active region and are spaced apart from each other.

33. The ternary CAM cell according to claim 32, wherein each of the first and second driver/access transistor active regions comprises:
 a driver transistor active region disposed to be parallel with the match cell active region;
 a pair of access transistor active regions extended from ends of the driver transistor active region toward another ternary CAM cell located opposite the load transistor active region; and
 a ground active region extended from a center of the driver transistor active region and disposed between the pair of access transistor active regions.

34. The ternary CAM cell according to claim 33, wherein each of the first and second SRAM cells comprises:
 first and second parallel common gate electrodes crossing over the load transistor active region and the driver transistor active region; and
 first and second access gate electrodes crossing over the access transistor active regions and being spaced from each other, the gate electrodes of the first SRAM cell being symmetric with the gate electrodes of the second SRAM cell with respect to a straight line crossing the center of the match cell active region.

35. The ternary CAM cell according to claim 34, wherein the first node line is electrically connected to the load transistor active region and the driver transistor active region, which are adjacent to the second common gate electrode of the first SRAM cell and are located opposite the first common gate electrode of the first SRAM cell, and the second node line is electrically connected to the load transistor active region and the driver transistor active region, which are adjacent to the second common gate electrode of the second SRAM cell and located opposite the first common gate electrode of the second SRAM cell.

36. The ternary CAM cell according to claim 25, wherein the match cell active region is formed in a first P-well, the first and second driver/access transistor active regions are formed in a second P-well spaced apart from the first P-well, and the first and second load transistor active regions are formed in an N-well between the first and second P-wells.

37. The ternary CAM cell according to claim 25, further comprising:
 a match line pad being located under the match line and electrically connected to the match cell active region between the first and second node gate electrodes;
 a lower interlayer insulating layer, a middle interlayer insulating layer and an upper interlayer insulating layer sequentially stacked between the match line and the match line pad;
 a lower match line contact plug penetrating the lower interlayer insulating layer to contact the match line pad;
 an upper match line contact plug penetrating the middle interlayer insulating and the upper interlayer insulating layer to be in contact with a top surface of the lower match line contact plug and a bottom surface of the match line; and
 first and second bit lines disposed in the middle interlayer insulating layer and located at both sides of the upper match line contact plug respectively.

38. A ternary CAM cell having a pair of half cells, each of the half cells comprising:
 a match cell active region and a first N-type active region disposed to be parallel with each other at a semiconductor substrate;
 a second N-type active region disposed to be adjacent to the first N-type active region and located opposite the match cell active region;
 first and second P-type active regions placed between the first and second N-type active regions, the first and second P-type active regions being adjacent to the first and second N-type active regions respectively;
 first and second gate electrodes crossing over the match cell active region and being spaced apart from each other;
 an SRAM cell including a first driver transistor and a first access transistor formed at the first N-type active region, a second driver transistor and a second access transistor formed at the second N-type active region, and first and second load transistors formed at the first and second P-type active regions respectively;
 a match line electrically connected to the match cell active region which is adjacent to the second gate electrode and is located opposite the first gate electrode; and
 a node line electrically connecting the second gate electrode to one of a pair of storage nodes of the SRAM cell.

39. The ternary CAM cell according to claim 38, wherein the pair of half cells are symmetric with each other with respect to a straight line crossing one end of the match cell active region, and the match cell active regions, the first N-type active regions, the second N-type active regions and the second P-type active regions of the pair of half cells are connected to each other.

40. The ternary CAM cell according to claim 38, further comprising a match cell ground line electrically connected to the match cell active region which is adjacent to the first gate electrode and is located opposite the second gate electrode.

41. The ternary CAM cell according to claim 38, wherein the match line is disposed to cross over the match cell active region.

42. The ternary CAM cell according to claim 40, wherein the match cell ground line is disposed to cross over the match cell active region.

43. The ternary CAM cell according to claim 38, further comprising a search line being electrically connected to the first gate electrode.

44. The ternary CAM cell according to claim 43, wherein the search line is placed to be parallel with the match cell active region.

45. The ternary CAM cell according to claim 38, wherein the match cell active region and the first N-type active region are disposed in a first P-well, the second N-type active region is disposed in a second P-well, and the first and second P-type active regions are disposed in an N-well between the first and second P-wells.

46. A ternary CAM cell comprising:
 a semiconductor substrate having a first half cell region and a second half cell region;
 a match cell active region placed across the first and second half cell regions;
 first and second search gate electrodes crossing over the match cell active region, the first and second search gate electrodes being located in the first and second half cell regions respectively;

first and second node gate electrodes crossing over the match cell active region between the first and second search gate electrodes, the first and second node gate electrodes being located in the first and second half cell regions respectively;
a match line electrically connected to the match cell active region between the first and second node gate electrodes;
a first driver/access transistor active region disposed across the first and second half cell regions;
a second driver/access transistor active region disposed to be parallel with the first driver/access transistor active region and located opposite the match cell active region;
a pair of first load transistor active regions respectively disposed in the first and second half cell regions between the first and second driver/access transistor active regions;
a second load transistor active region disposed across the first and second half cell regions between the second driver/access transistor active region and the first load transistor active regions;
a first SRAM cell including a first driver transistor and a first access transistor formed at the first driver/access transistor active region in the first half cell region, a second driver transistor and a second access transistor formed at the second driver/access transistor active region in the first half cell region, and first and second load transistors respectively formed at the first and second load transistor active regions in the first half cell region;
a second SRAM cell including a first driver transistor and a first access transistor formed at the first driver/access transistor active region in the second half cell region, a second driver transistor and a second access transistor formed at the second driver/access transistor active region in the second half cell region, and first and second load transistors respectively formed at the first and second load transistor active regions in the second half cell region;
a first node line electrically connecting the first node gate electrode to one of a pair of storage nodes of the first SRAM cell; and
a second node line electrically connecting the second node gate electrode to one of a pair of storage nodes of the second SRAM cell.

47. The ternary CAM cell according to claim 46, wherein the match line is disposed to cross over the match cell active region.

48. The ternary CAM cell according to claim 46, wherein the match cell active region between the first and second node gate electrodes is extended to be in contact with a match cell active region of another ternary CAM cell located opposite the SRAM cells.

49. The ternary CAM cell according to claim 46, further comprising first and second match cell ground lines electrically connected to both ends of the match cell active region respectively, which are adjacent to the first and second search gate electrodes.

50. The ternary CAM cell according to claim 49, wherein the first and second match cell ground lines are disposed to cross over the match cell active regions.

51. The ternary CAM cell according to claim 46, further comprising first and second search lines electrically connected to the first and second search gate electrodes respectively.

52. The ternary CAM cell according to claim 51, wherein the first and second search lines are parallel with the match cell active region.

53. The ternary CAM cell according to claim 46, wherein the pair of first load transistor active regions are parallel with the match cell active region and are spaced apart from each other.

54. The ternary CAM cell according to claim 46, wherein each of the first and second SRAM cells comprises:
a first common gate electrode crossing over the first driver/access transistor active region and the first load transistor active region adjacent to the first driver/access transistor active region, the first common gate electrode being extended to overlap with one end of the second load transistor active region;
a second common gate electrode crossing over the second driver/access transistor active region and the second load transistor active region adjacent to the second driver/access transistor active region, the second common gate electrode being extended to overlap with one end of the first load transistor active region and being parallel with the first common gate electrode;
a first access gate electrode crossing over the first driver/access transistor active region and being parallel with the first common gate electrode; and
a second access gate electrode crossing over the second driver/access transistor active region and being parallel with the second common gate electrode, the gate electrodes of the first SRAM cell being symmetric with the gate electrodes of the second SRAM cell with respect to a straight line crossing the center of the match cell active region.

55. The ternary CAM cell according to claim 54, wherein the first node line is electrically connected to the first driver/access transistor active region between the first common gate electrode and the first access gate electrode of the first SRAM cell, the first load transistor active region between the first and second common gate electrodes of the first SRAM cell, the second common gate electrode of the first SRAM cell, and the first node gate electrode, and the second node line is electrically connected to the first driver/access transistor active region between the first common gate electrode and the first access gate electrode of the second SRAM cell, the first load transistor active region between the first and second common gate electrodes of the second SRAM cell, the second common gate electrode of the second SRAM cell, and the second node gate electrode.

56. The ternary CAM cell according to claim 46, wherein the match cell active region and the first driver/access transistor active region are disposed in a first P-well, the second driver/access transistor active region is disposed in a second P-well spaced apart from the first P-well, and the first and second load transistor active regions are disposed in an N-well between the first and second P-wells.

57. The ternary CAM cell according to claim 54, further comprising:
a first word line electrically connected to the first and second access gate electrodes of the first SRAM cell and extended to cross over the match cell active region;
a second word line electrically connected to the first and second access gate electrodes of the second SRAM cell and extended to cross over the match cell active region;
a first bit line electrically connected to the first driver/access transistor active region between the first access gate electrodes of the first and second SRAM cells, the first bit line being parallel with the first driver/access transistor active region; and a second bit line electrically connected to both ends of the second driver/access transistor active region adjacent to the second access gate electrodes, the second bit line being parallel with the second driver/access transistor active region.

* * * * *

UNITED STATES PATENT AND TRADEMARK OFFICE
CERTIFICATE OF CORRECTION

PATENT NO.         : 7,112,831 B2
APPLICATION NO. : 10/841775
DATED              : September 26, 2006
INVENTOR(S)        : Jin-Ho Kim et al.

It is certified that error appears in the above-identified patent and that said Letters Patent is hereby corrected as shown below:

Column 6, line 37, the word "91" should read -- 9I --;
Column 6, line 58, the word "91" should read -- 9I --;
Column 8, line 20, the word "91" should read -- 9I --;
Column 10, line 14, the word "SB'" should read -- 5B' --;
Column 10, line 15, the word "SB''" should read -- 5B" --;
Column 10, line 18, the words "SB' and SB''" should read -- 5B' and 5B" --;
Column 10, line 23, the words "SC' and SC''" should read -- 5C' and 5C" --;
Column 10, line 27, the words "SA, SB', SB", SC' and SC''" should read -- 5A, 5B', 5B", 5C' and 5C" --;
Column 10, line 55, the word "91" should read -- 9I --;
Column 11, line 57, the word "91" should read -- 9I --;
Column 12, line 2, the word "N1" should read -- N11 --;
Column 17, line 63, the word "1071" should read -- 107I --;
Column 19, line 8, the word "1071" should read -- 107I --;
Column 21, line 37, the word "1first" should read -- first --.

Signed and Sealed this

Fourth Day of August, 2009

JOHN DOLL
*Acting Director of the United States Patent and Trademark Office*